US010091850B2

(12) United States Patent
Song et al.

(10) Patent No.: US 10,091,850 B2
(45) Date of Patent: Oct. 2, 2018

(54) BACKLIGHT UNIT USING MULTI-CELL LIGHT EMITTING DIODE

(71) Applicant: Seoul Semiconductor Co., Ltd., Ansan-si (KR)

(72) Inventors: Young Jun Song, Ansan-si (KR); Jung Hwa Jung, Ansan-si (KR); Eun Ju Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/678,739

(22) Filed: Aug. 16, 2017

(65) Prior Publication Data

US 2017/0347418 A1 Nov. 30, 2017

Related U.S. Application Data

(63) Continuation of application No. 15/354,292, filed on Nov. 17, 2016, now Pat. No. 9,769,897, which is a continuation of application No. PCT/KR2016/006768, filed on Jun. 24, 2016.

(30) Foreign Application Priority Data

Jun. 26, 2015 (KR) .................. 10-2015-0091420
Jul. 3, 2015 (KR) .................. 10-2015-0095536
(Continued)

(51) Int. Cl.
*H05B 33/08* (2006.01)
*H01L 33/14* (2010.01)
(Continued)

(52) U.S. Cl.
CPC ....... *H05B 33/0845* (2013.01); *H01L 33/145* (2013.01); *H01L 33/42* (2013.01);
(Continued)

(58) Field of Classification Search
None
See application file for complete search history.

(56) References Cited

U.S. PATENT DOCUMENTS

2013/0277696 A1 10/2013 Matsui et al.
2015/0084084 A1 3/2015 Chae et al.
(Continued)

FOREIGN PATENT DOCUMENTS

JP 2012-138499 7/2012
KR 10-2012-0031342 4/2012
(Continued)

OTHER PUBLICATIONS

International Search Report dated Dec. 29, 2016 in PCT/KR/2016/006768.
(Continued)

*Primary Examiner* — Dedei K Hammond
(74) *Attorney, Agent, or Firm* — H.C. Park & Associates, PLC

(57) ABSTRACT

A backlight unit includes a backlight module with a printed circuit board including blocks and MJT LEDs disposed on the blocks, respectively and a backlight control module generating a signal for drive control of each of the blocks, wherein each of the blocks comprises at least one MJT LED, and the backlight control module includes a drive controller for On/Off control and dimming control of each of the blocks.

20 Claims, 24 Drawing Sheets

(30) Foreign Application Priority Data

Jul. 16, 2015 (KR) .................. 10-2015-0101214
Jul. 22, 2015 (KR) .................. 10-2015-0103840
Jul. 30, 2015 (KR) .................. 10-2015-0108262

(51) Int. Cl.
*H01L 33/62* (2010.01)
*H01L 33/48* (2010.01)
*H01L 33/42* (2010.01)
*G02F 1/1335* (2006.01)

(52) U.S. Cl.
CPC ............ *H01L 33/486* (2013.01); *H01L 33/62* (2013.01); *G02F 1/133603* (2013.01); *G02F 2001/133612* (2013.01)

(56) References Cited

U.S. PATENT DOCUMENTS

| | | |
|---|---|---|
| 2015/0216009 A1 | 7/2015 | Lee et al. |
| 2015/0245427 A1 | 8/2015 | Jung et al. |
| 2015/0282260 A1 | 10/2015 | Hussell et al. |
| 2015/0359056 A1 | 12/2015 | Song et al. |

FOREIGN PATENT DOCUMENTS

| | | |
|---|---|---|
| KR | 10-2013-0103263 | 9/2013 |
| KR | 10-2014-0045094 | 4/2014 |
| KR | 10-2014-0117791 | 10/2014 |
| KR | 10-2015-0014135 | 2/2015 |
| KR | 10-2015-0025797 | 3/2015 |
| KR | 10-2015-0033548 | 4/2015 |

OTHER PUBLICATIONS

Written Opinion dated Dec. 29, 2016 in PCT/KR2016/006768.
Non-Final Office Action dated Jan. 27, 2017, in U.S. Appl. No. 15/354,292.
Notice of Allowance dated May 26, 2017, in U.S. Appl. No. 15/354,292.
Notice of Allowance dated Apr. 13, 2018, issued in U.S. Appl. No. 15/873,769.

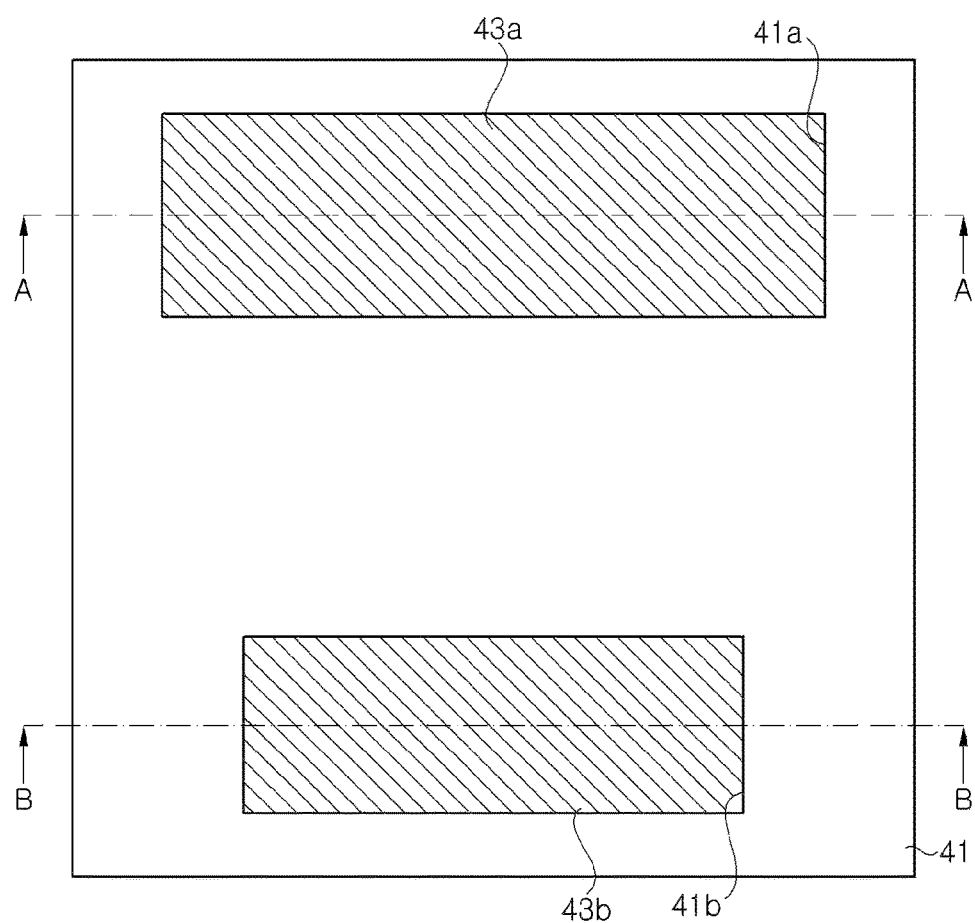

B1 - B2

C1 − C2

D1 − D2

E1 − E2

BACKLIGHT UNIT USING MULTI-CELL LIGHT EMITTING DIODE

CROSS-REFERENCE TO RELATED APPLICATIONS

This application is a Continuation of U.S. patent application Ser. No. 15/354,292, filed on Nov. 17, 2016, which is a Continuation of International Patent Application No. PCT/KR2016/006768, filed on Jun. 24, 2016, and claims priority from and the benefit of Korean Patent Application No. 10-2015-0091420, filed on Jun. 26, 2015; Korean Patent Application No. 10-2015-0095536, filed on Jul. 3, 2015; Korean Patent Application No. 10-2015-0101214, filed on Jul. 16, 2015; Korean Patent Application No. 10-2015-0103840, filed on Jul. 22, 2015; and Korean Patent Application No. 10-2015-0108262, filed on Jul. 30, 2015, which are hereby incorporated by reference for all purposes as if fully set forth herein.

BACKGROUND

Field

Exemplary embodiments of the disclosure relate to a backlight unit using multi-cell light emitting diodes, and more particularly, to a backlight unit allowing low-current driving using multi-cell light emitting diodes configured to increase an effective luminous area of each light emitting cell.

Discussion of the Background

A liquid crystal display realizes an image by controlling transmittance of light emitted from a backlight unit. Although a cold cathode fluorescent lamp (CCFL) was generally used in the art, a light emitting diode (LED) has been generally used in recent years due to various advantages such as low power consumption, long lifespan, and environmental friendliness.

A light source for a liquid crystal display is classified into an edge type backlight unit and a direct type backlight unit depending upon the location of light emitting diodes. The edge type backlight unit is provided with a light guide plate and light emitting diodes acting as a light source are disposed on a side surface of the light guide plate such that light emitted from the light source is discharged to a liquid crystal panel through the light guide plate. Such an edge type backlight unit can reduce the number of light emitting diodes and does not require a low degree of quality deviation between the light emitting diodes, thereby enabling reduction in manufacturing costs and development of low power products. However, the edge type backlight unit has a limitation in the realization of high quality images due to difficulty in overcoming the difference in brightness between corners and a central region of the liquid crystal display.

On the other hand, the direct type backlight unit includes light emitting diodes disposed under a liquid crystal panel such that light can be directly supplied from a sheet light source having substantially the same area as the liquid crystal panel to an overall surface of the liquid crystal panel. As a result, the direct type backlight unit can minimize the difference in brightness between the corners and the central region of the liquid crystal panel while realizing high quality images.

However, in the direct type backlight unit, the light emitting diodes are densely arranged to achieve uniform back lighting with respect to a relatively large area, thereby causing damage to a drive circuit and deterioration in stability and reliability of the backlight unit resulting therefrom.

FIG. 1 is a block diagram of a typical backlight unit using LEDs and problems of the typical backlight unit will be described in more detail with reference to FIG. 1. Referring to FIG. 1, a typical backlight unit 1 includes a backlight control module 2 and a backlight module 5.

The backlight control module 2 includes a drive power generator 3 configured to generate and output DC drive power using input voltage Vin and a drive controller 4 configured to control operation of each of a plurality of LED arrays 6a to 6n which constitute the backlight module 5. Generally, the drive power generator 3 generates and outputs a DC voltage of 12 V, 24 V, 48 V, or the like.

The backlight module 5 includes the plurality of LED arrays 6a to 6n each including a plurality of LEDs connected to each other in series and an optical member (not shown) for improving luminous efficacy of light emitted from the plurality of LED arrays 6a to 6n. In FIG. 1, the backlight module 5 includes n LED arrays 6a to 6n connected to each other in parallel and each including 5 LEDs connected to each other in series. Here, the typical LEDs generally have a forward voltage level of 3V to 6.5V. Since it is difficult to control individual operation of such typical LEDs through connection to the drive power generator 3, the LEDs are connected to each other in series to constitute LED arrays such that each of the LED arrays can be individually driven and controlled. In such a typical backlight unit 1, the drive controller 4 may be configured to control brightness of all of the LED arrays 6a to 6n constituting the backlight module 5 through pulse width modulation (PWM) control of drive power supplied to the backlight module 5 in response to a dimming signal Dim input from the outside. Alternatively, in the backlight unit 1, the drive controller 4 may be configured to control brightness of a specific LED array among the LED arrays 6a to 6n by regulating the magnitude of drive current flowing through the specific LED array in response to a dimming signal Dim input from the outside.

Each of the LEDs used in such a typical backlight unit 1 is generally a single-cell LED and is driven by low voltage and high current. For example, the single-cell LED has a drive voltage of 3.6 V and can be operated by a drive current of 250 mA to 500 mA. Thus, in order to control operation of the backlight module 5 composed of such single-cell LEDs, peripheral circuits including the drive controller 4 are composed of large capacity electronic elements capable of handling high current, thereby causing increase in manufacturing costs. In addition, the peripheral circuits including the drive controller 4 can be damaged due to high-current driving of the aforementioned typical single-cell LED, thereby causing deterioration in stability and reliability of the backlight unit 1. Moreover, the high-current driving of the single-cell LEDs cause increase in power consumption and a droop phenomenon.

SUMMARY

Exemplary embodiments of the disclosure may provide a backlight unit having a small size and including a small number of light emitting diodes while securing the same level of luminous intensity as a typical backlight unit.

Exemplary embodiments of the disclosure may provide a backlight unit capable of preventing or reducing deterioration in performance due to a droop phenomenon of light emitting diodes under high current driving conditions.

Exemplary embodiments of the disclosure may provide a backlight module capable of being driven with low current using multi junction technology light emitting diodes (MJT LEDs) each including a plurality of light emitting cell, and a backlight unit including the same.

Exemplary embodiments of the disclosure may provide an MJT LED chip configured to increase an effective luminous area of each light emitting cell and a method of manufacturing the same.

Exemplary embodiments of the disclosure may provide a backlight unit which includes a backlight module capable of being driven with low current using MJT LEDs, thereby improving stability and reliability of a drive circuit configured to control operation of the backlight module while reducing manufacturing costs thereof.

Exemplary embodiments of the disclosure may provide a backlight unit which includes a backlight module capable of being driven with low current using MJT LEDs, thereby improving power efficiency and luminous efficacy while preventing a droop phenomenon upon high-current driving.

Exemplary embodiments of the disclosure may provide a backlight unit which includes a backlight module capable of being driven with low current using MJT LEDs, thereby minimizing the number of LEDs and enabling individual drive control of each MJT LED.

Exemplary embodiments of the disclosure may provide a backlight unit which includes a backlight module using multi-cell light emitting diodes configured to allow light emitted from each of the light emitting diodes to be uniformly supplied to a liquid crystal panel, thereby improving stability and reliability of the backlight unit.

In accordance with one exemplary embodiment of the disclosure, a backlight unit includes: a base and a plurality of light emitting diode packages disposed on a lower surface of the base, wherein each of the light emitting diode packages includes at least one light emitting diode, and the light emitting diode includes: a first conductive type semiconductor layer; a mesa disposed on the first conductive type semiconductor layer and including an active layer and a second conductive type semiconductor layer; a reflective electrode structure disposed on the mesa; a current spreading layer covering the mesa and the first conductive type semiconductor layer and having a first opening exposing the reflective electrode structure, the current spreading layer being electrically connected to the first conductive type semiconductor layer and insulated from the reflective electrode structure and the mesa; and an upper insulation layer covering the current spreading layer, the upper insulation layer including a second opening exposing the current spreading layer to define a first electrode pad region and a third opening exposing an upper region of the exposed reflective electrode structure to define a second electrode pad region.

The light emitting diode may further include an anti-diffusion reinforcement layer disposed on the reflective electrode structure in the first opening of the current spreading layer, wherein the anti-diffusion reinforcement layer is exposed through the third opening of the upper insulation layer.

The anti-diffusion reinforcement layer may be formed of the same material as the current spreading layer.

The current spreading layer may include an ohmic contact layer, a reflective metal layer, an anti-diffusion layer and an anti-oxidation layer; the anti-diffusion layer may include at least one metal layer formed of a metal selected from the group consisting of Cr, Ti, Ni, Mo, TiW and W; and the anti-oxidation layer may include an Au layer, an Ag layer or an organic material layer.

The anti-diffusion layer may include at least two pairs of Ti/Ni or Ti/Cr layers. The current spreading layer may further include a bonding layer disposed on the anti-oxidation layer.

The reflective electrode structure may include a reflective metal layer; a capping metal layer; and an anti-oxidation metal layer, wherein the reflective metal layer has an inclined side surface such that an upper surface of the reflective metal layer has a smaller surface area than a lower surface thereof, the capping metal layer covers the upper surface and the side surface of the reflective metal layer, and the reflective metal layer includes a stress relief layer formed at an interface with the capping metal layer.

The mesa may include elongated branches extending parallel to each other in one direction and a connecting portion connecting the branches to each other, and the first opening may be disposed on the connecting portion.

The mesa may be provided in plural and the plural mesas may have an elongated shape extending parallel to each other in one direction.

The light emitting diode may further include an ohmic contact structure disposed on the first conductive type semiconductor layer between the mesas and electrically connected to the current spreading layer.

The light emitting diode may further include a lower insulation layer disposed between the mesa and the current spreading layer and insulating the current spreading layer from the mesa, and the lower insulation layer may include a fourth opening placed in an upper region of the mesa and exposing the reflective electrode structure.

The first opening may have a greater width than the fourth opening so as to allow the fourth opening to be exposed therethrough.

The light emitting diode may further include an anti-diffusion reinforcement layer disposed in the first opening and the fourth opening, and the anti-diffusion reinforcement layer may be exposed through the third opening.

The lower insulation layer may include a silicon oxide layer and the upper insulation layer may include a silicon nitride layer.

The backlight unit may further include an optical member including a light incidence plane receiving light emitted from the light emitting diode and a light exit plane through which light is emitted at a greater beam angle than the light emitted from the light emitting diode.

The light emitting diode package may further include a wavelength convertor containing a phosphor and having a uniform thickness covering a lower surface of the first conductive type semiconductor layer.

The wavelength convertor may extend from the lower surface of the first conductive type semiconductor layer and cover a side surface of the light emitting diode and may be composed of a single crystal phosphor.

The light emitting diode package may further include a bonding layer between the wavelength convertor and the first conductive type semiconductor layer.

The light emitting diode package may include a plurality of light emitting diodes connected to each other in series.

The light emitting diode may further include a substrate disposed on the lower surface of the first conductive type semiconductor layer, and the plurality of light emitting diodes may share a single substrate.

A lower surface of the base may face an upper surface of the light emitting diode.

In accordance with another exemplary embodiment of the disclosure, a backlight unit includes: a backlight module including a printed circuit board including a plurality of blocks and a plurality of MJT LEDs disposed on the plurality of blocks, respectively, each of the MJT LEDs including: a growth substrate; a plurality of light emitting cells arranged on the substrate and each including a first semiconductor layer, an active layer and a second semiconductor layer; a plurality of upper electrodes arranged on the plurality of light emitting cells and formed of the same material, the plurality of upper electrodes being electrically connected to the first semiconductor layers of the corresponding light emitting cells; and a first pad and a second pad arranged on the upper electrodes, wherein at least one of the upper electrodes is electrically connected to the second semiconductor layer of the light emitting cell adjacent thereto, the other upper electrode is insulated from the second semiconductor layer of the light emitting cell adjacent thereto, the light emitting cells are connected to each other in series through the upper electrodes, the first pad is electrically connected to an input light emitting cell among the light emitting cells connected to each other in series, the second pad is electrically connected to an output light emitting cell among the light emitting cells connected to each other in series, the light emitting cells are separated from each other by a mesa etching region through which the substrate is exposed, and operations of the plurality of MJT LEDs are individually controlled.

The backlight unit may further include a first interlayer insulation layer disposed between the light emitting cells and the upper electrodes, and each of the upper electrodes may have a side surface inclined at an inclination of 10° to 45° with respect to a surface of the first interlayer insulation layer.

Each of the upper electrodes may have a thickness of 2,000 Å to 10,000 Å.

The backlight unit may further include lower electrodes each disposed on the second semiconductor layer of each of the light emitting cells, wherein the first interlayer insulation layer exposes a portion of the lower electrode on each of the light emitting cells, and the upper electrode(s) electrically connected to the second semiconductor layer of the light emitting cell adjacent thereto may be connected to the exposed lower electrode through the first interlayer insulation layer.

Each of the lower electrodes may have a side surface inclined at an inclination of 10° to 45° with respect to a surface of the second interlayer insulation layer.

Each of the lower electrodes may have may have a thickness of 2,000 Å to 10,000 Å.

The first interlayer insulation layer may have a side surface inclined at an inclination of 10° to 60° with respect to an exposed surface of the lower electrode.

The first interlayer insulation layer may have a thickness of 2,000 Å to 20,000 Å.

The backlight unit may further include a second interlayer insulation layer covering the upper electrodes, wherein the second interlayer insulation layer exposes a lower electrode arranged on the second semiconductor layer of an input light emitting cell and an upper electrode connected to the first semiconductor layer of an output light emitting cell, and the first pad and the second pad may be connected to the lower electrode and the upper electrode through the second interlayer insulation layer.

The second interlayer insulation layer may have a side surface inclined at an inclination of 10° to 60° with respect to a surface of the upper electrode.

The second interlayer insulation layer may have a thickness of 2,000 Å to 20,000 Å.

Each of the light emitting cells may include a via-hole partially exposing the first semiconductor layer and the upper electrodes may be connected to the first semiconductor layers of the corresponding light emitting cells through the via-holes.

Each of the layers exposed through the via-holes may include a side surface inclined at an inclination of 10° to 60°.

The upper electrode may occupy 30% to less than 100% the total area of the MJT LED.

The upper electrode may have a plate or sheet shape having a ratio of length to width in the range of 1:3 to 3:1.

At least one of the upper electrodes may have a greater length or width than the length or width of the corresponding light emitting cell.

Each of the layers exposed by mesa etching may include a side surface inclined at an inclination of 10° to 60° with respect to the substrate.

The backlight unit may further include a backlight control module supplying a drive voltage to the plurality of MJT LEDs in the backlight module, wherein each of the blocks may include at least one MJT LED and the backlight control module may independently control operation of each of the MJT LEDs.

The backlight control module may include a drive power generator and a drive controller.

The drive power generator may independently supply the drive voltage to each of the MJT LEDs in the backlight module and the drive controller may perform dimming control of the at least one MJT LED through PWM control in response to a dimming signal from the backlight control module.

The drive controller may generate a dimming control signal subjected to pulse width modulation or duty ratio modulation.

The drive controller may independently detect and control a drive current for each of the MJT LEDs in the backlight module.

The drive controller may be configured to perform dimming control of at least one of the MJT LEDs by controlling a drive current of the at least one MJT LED in response to a dimming signal.

The first pad of the MJT LED may be connected to the drive power generator and the second pad of the MJT LED may be connected to the drive controller.

The number of blocks may be M×N and the plurality of blocks may be arranged in an M×N matrix.

At least one of the blocks may include a plurality of MJT LEDs.

The backlight unit may further include a plurality of FETs electrically connected to the plurality of MJT LEDs and an FET controller configured to control On/Off functions of the FETs, wherein the number of FETs may be the same as the number of MJT LEDs.

The FET controller may include at least one of the FETs.

The number of FETs not included in the FET controller may be less than the number of MJT LEDs.

The FET controller may include all of the FETs.

In accordance with a further exemplary embodiment of the disclosure, a backlight unit includes: a backlight module including a printed circuit board including a plurality of blocks and a plurality of MJT LEDs disposed on the plurality of blocks, respectively; and a backlight control module supplying a drive voltage to the plurality of MJT LEDs in the backlight module, wherein each of the blocks includes at least one MJT LED and the backlight control module independently controls operation of each of the MJT LEDs.

The backlight control module may include a drive power generator and a drive controller.

The drive power generator may independently supply the drive voltage to each of the MJT LEDs in the backlight module and the drive controller may perform dimming control of the at least one MJT LED through PWM control in response to a dimming signal from the backlight control module.

The drive controller may generate a dimming control signal subjected to pulse width modulation or duty ratio modulation.

The drive controller may independently detect and control a drive current for each of the MJT LEDs in the backlight module.

The drive controller may be configured to perform dimming control of at least one of the MJT LEDs by controlling a drive current of the at least one MJT LED in response to a dimming signal.

An anode of the MJT LED may be connected to the drive power generator and a cathode of the MJT LED may be connected to the drive controller.

Each of the blocks may include one optical member.

Each of the blocks may have a longitudinal length of 60 mm or less.

Each of the blocks may have a transverse length of 55 mm or less.

The number of blocks may be M×N and the plurality of blocks may be arranged in an M×N matrix.

At least one of the blocks may include a plurality of MJT LEDs.

Each of the MJT LEDs may include first to $N^{th}$ light emitting cells (N being a natural number of 2 or more) and the $N^{th}$ light emitting cell may be electrically connected to the $N-1^{th}$ light emitting cell by the same connection structure between the first light emitting cell and the second light emitting cell.

The first to $N^{th}$ light emitting cells may be connected to each other in series and driven by a drive voltage of 2.5 V to 4 V, and the MJT LED may be driven by a drive voltage of at least 10 V or more.

The MJT LED may include a first light emitting cell and a second light emitting cell disposed on a growth substrate to be separated from each other and each including a lower semiconductor layer, an upper semiconductor layer disposed on the lower semiconductor layer, and an active layer disposed between the upper and lower semiconductor layers; a first transparent electrode layer disposed on the first light emitting cell and electrically connected to the first light emitting cell; an interconnection line electrically connecting the first light emitting cell to the second light emitting cell; and an insulation layer insulating the interconnection line from a side surface of the first light emitting cell, wherein the interconnection line includes a first connection portion electrically connected to the first light emitting cell and a second connection portion electrically connected to the second light emitting cell, one surface of the lower semiconductor layer includes an exposed region through which the lower semiconductor layer is exposed, the first connection portion contacts the first transparent electrode layer, and the second connection portion is electrically connected to the lower semiconductor layer of the second light emitting cell through the exposed region.

A portion of the first transparent electrode layer may be connected to the second light emitting cell.

A portion of the first transparent electrode layer may extend from an upper surface of the first light emitting cell to a side surface of the lower semiconductor layer of the second light emitting cell through a space between the first light emitting cell and the second light emitting cell.

A portion of the first transparent electrode layer disposed on the side surface of the lower semiconductor layer of the second light emitting cell may have a larger width than a portion of the interconnection line disposed on the side surface of the lower semiconductor layer of the second light emitting cell.

A portion of the first transparent electrode layer disposed between the first light emitting cell and the second light emitting cell may have a larger width than a portion of the interconnection line disposed between the first light emitting cell and the second light emitting cell.

The first transparent electrode layer may separate the interconnection line and the insulation layer from each other.

A portion of the insulation layer may be disposed on a portion between the first light emitting cell and the second light emitting cell on the growth substrate.

The backlight unit may further include a current blocking layer disposed between the first light emitting cell and the first transparent electrode layer and separating a portion of the first transparent electrode layer from the first light emitting cell.

The first transparent electrode layer may be disposed between the second connection portion and the lower semiconductor layer of the second light emitting cell.

The backlight unit may further include a light transmitting plate disposed above the printed circuit board, wherein a distance between an upper surface of the printed circuit board and a lower surface of the light transmitting plate may be 18 mm or more.

The drive controller may include a switch controller electrically connecting the plurality of MJT LEDs to each other or electrically insulating the plurality of MJT LEDs from each other.

The switch controller may connect the plurality of MJT LEDs to each other in series and/or in parallel.

The backlight module may further include a wavelength conversion layer containing phosphors and covering the MJT LED, and light having been emitted from the MJT LED and passed through the wavelength conversion layer may have an NTSC color reproduction of 70% or more.

Each of the blocks may have a gradually decreasing area with increasing number of light emitting cells in the MJT LED.

In accordance with yet another exemplary embodiment of the disclosure, a backlight unit includes a backlight module including a printed circuit board including a plurality of blocks and a plurality of MJT LEDs disposed on the plurality of blocks, respectively, each of the MJT LEDs including: a first light emitting cell and a second light emitting cell disposed on a growth substrate to be separated from each other and each including a lower semiconductor layer, an upper semiconductor layer disposed on the lower semiconductor layer, and an active layer disposed between the upper and lower semiconductor layers; a first transparent electrode layer disposed on the first light emitting cell and electrically connected to the first light emitting cell; an interconnection line electrically connecting the first light emitting cell to the second light emitting cell; and an insulation layer insulating the interconnection line from a side surface of the first light emitting cell, wherein the interconnection line includes a first connection portion electrically connected to the first light emitting cell and a second connection portion electrically connected to the second light emitting cell, one surface of the lower semiconductor layer includes an exposed region through which the lower semiconductor layer is exposed, the first connection portion contacts the first transparent electrode layer, the second connection portion is electrically connected to the lower semiconductor layer of the second light emitting cell through the exposed region, and operation of each of the MJT LEDs is independently controlled.

A portion of the first transparent electrode layer may be connected to the second light emitting cell.

A portion of the first transparent electrode layer may extend from an upper surface of the first light emitting cell to a side surface of the lower semiconductor layer of the second light emitting cell through a space between the first light emitting cell and the second light emitting cell.

A portion of the first transparent electrode layer disposed on the side surface of the lower semiconductor layer of the second light emitting cell may have a larger width than a portion of the interconnection line disposed on the side surface of the lower semiconductor layer of the second light emitting cell.

A portion of the first transparent electrode layer disposed between the first light emitting cell and the second light emitting cell may have a larger width than a portion of the interconnection line disposed between the first light emitting cell and the second light emitting cell.

The first transparent electrode layer may separate the interconnection line and the insulation layer from each other.

A portion of the insulation layer may be disposed on a portion between the first light emitting cell and the second light emitting cell on the growth substrate.

The backlight unit may further include a current blocking layer disposed between the first light emitting cell and the first transparent electrode layer and separating a portion of the first transparent electrode layer from the first light emitting cell.

The first transparent electrode layer may be disposed between the second connection portion and the lower semiconductor layer of the second light emitting cell.

The backlight unit may further include a plurality of FETs electrically connected to the plurality of MJT LEDs and an FET controller configured to control On/Off functions of the FETs, wherein the number of FETs is the same as the number of MJT LEDs.

The FET controller may include at least one of the FETs.

The number of FETs not included in the FET controller may be less than the number of MJT LEDs.

The FET controller may include all of the FETs.

In accordance with yet another exemplary embodiment of the disclosure, a backlight unit includes: a printed circuit board including a plurality of blocks; a backlight module including a plurality of multi-cell light emitting diodes disposed on the plurality of blocks; a backlight control module supplying a drive voltage to the plurality of multi-cell light emitting diodes and independently controlling operation of each of the multi-cell light emitting diodes; and at least one first optical member covering the plurality of multi-cell light emitting diodes, wherein each of the blocks includes at least one multi-cell light emitting diode, and assuming that major and minor axes of each of the blocks are a and b, respectively, light emitted through the at least one first optical member may have a full width at half maximum greater than or equal to 0.6a and less than or equal to $\sqrt{a^2+b^2}$.

a and b may be the same, and when the light emitted through the at least one first optical member may have a full width at half maximum greater than or equal to a, the light emitted through the at least one first optical member may have an intensity of 100% or more.

a may be 60 mm or less and b may be 55 mm or less.

In accordance with yet another exemplary embodiment of the disclosure, a backlight unit includes: a printed circuit board including a plurality of blocks; a backlight module including a plurality of multi-cell light emitting diodes disposed on the plurality of blocks; a backlight control module supplying a drive voltage to the plurality of multi-cell light emitting diodes and independently controlling operation of each of the multi-cell light emitting diodes; and at least one first optical member covering the plurality of multi-cell light emitting diodes, wherein each of the blocks includes at least one multi-cell light emitting diode and light emitted through the at least one first optical member has a beam angle ($\theta_{Lens}$) represented by Equation 1.

$$\theta_{Lens} > 2\tan^{-1}\left(\frac{FWHM_{LED}}{2OD}\right) \quad \text{[Equation 1]}$$

wherein $FWHM_{LED}$ is the full width at half maximum of light emitted from the multi-cell light emitting diode without the first optical member and OD is a distance from a bottom surface of the multi-cell light emitting diode to a bottom surface of a diffusive plane.

The backlight control module may further include: a drive power generator independently supplying the drive voltage to each of the multi-cell light emitting diodes; and a drive controller performing dimming control of the at least one multi-cell light emitting diode through PWM control in response to a dimming signal from the backlight control module.

The drive controller may generate a dimming control signal subjected to pulse width modulation or duty ratio modulation and may independently detect and control a drive current for each of the multi-cell light emitting diodes.

The drive controller may perform dimming control of at least one of the multi-cell light emitting diodes by controlling a drive current of the at least one multi-cell light emitting diode in response to a dimming signal.

An anode of the multi-cell light emitting diode may be connected to the drive power generator and a cathode of the multi-cell light emitting diode may be connected to the drive controller.

The backlight unit may further include a second optical member disposed on the printed circuit board so as to correspond to the plurality of multi-cell light emitting diodes. The second optical member may include a light incidence plane receiving light emitted from the multi-cell light emitting diode and a light exit plane through which light is emitted at a greater beam angle than the light emitted from the multi-cell light emitting diode.

The first optical member may be formed by molding a resin on the multi-cell light emitting diode.

The number of blocks may be M×N and the plurality of blocks may be arranged in an M×N matrix.

Each of the multi-cell light emitting diodes may include first to $N^{th}$ light emitting cells (N being a natural number of 2 or more) and the $N^{th}$ light emitting cell may be electrically connected to the N-1$^{th}$ light emitting cell by the same connection structure between the first light emitting cell and the second light emitting cell.

The backlight unit may further include a plurality of FETs electrically connected to the plurality of multi-cell light emitting diodes and an FET controller configured to control On/Off functions of the FETs, wherein the number of FETs is the same as the number of multi-cell light emitting diodes.

The FET controller may be configured to control at least one of the FETs, and the number of FETs not controlled by the FET controller may be less than the number of multi-cell light emitting diodes.

The FET controller may be configured to control all of the FETs.

The backlight unit may further include an optical sheet configured to improve uniformity of light emitted through the at least one first optical member.

In accordance with yet another exemplary embodiment of the disclosure, a backlight unit includes: a printed circuit board including a plurality of blocks; a backlight module including a plurality of multi-cell light emitting diodes disposed on the plurality of blocks; and at least one first optical member covering the plurality of multi-cell light emitting diodes, each of the multi-cell light emitting diodes including: a first light emitting cell and a second light emitting cell disposed on a growth substrate to be separated from each other and each including a lower semiconductor layer, an upper semiconductor layer disposed on the lower semiconductor layer, and an active layer disposed between the upper and lower semiconductor layers; a first transparent electrode layer disposed on the first light emitting cell and electrically connected to the first light emitting cell; an interconnection line electrically connecting the first light emitting cell to the second light emitting cell; and an insulation layer insulating the interconnection line from a side surface of the first light emitting cell, wherein the interconnection line includes a first connection portion electrically connected to the first light emitting cell and a second connection portion electrically connected to the second light emitting cell, one surface of the lower semiconductor layer includes an exposed region through which the lower semiconductor layer is exposed, the first connection portion contacts the first transparent electrode layer, the second connection portion is electrically connected to the lower semiconductor layer of the second light emitting cell through the exposed region, operation of each of the plurality of multi-cell light emitting diodes is independently controlled, and assuming that major and minor axes of each of the blocks are a and b, respectively, light emitted through the at least one first optical member may have a full width at half maximum greater than or equal to 0.6a and less than or equal to $\sqrt{a^2+b^2}$.

In accordance with yet another exemplary embodiment of the disclosure, a backlight unit includes: a printed circuit board including a plurality of blocks; a backlight module including a plurality of multi-cell light emitting diodes disposed on the plurality of blocks; and at least one first optical member covering the plurality of multi-cell light emitting diodes, each of the multi-cell light emitting diodes including: a first light emitting cell and a second light emitting cell disposed on a growth substrate to be separated from each other and each including a lower semiconductor layer, an upper semiconductor layer disposed on the lower semiconductor layer, and an active layer disposed between the upper and lower semiconductor layers; a first transparent electrode layer disposed on the first light emitting cell and electrically connected to the first light emitting cell; an interconnection line electrically connecting the first light emitting cell to the second light emitting cell; and an insulation layer insulating the interconnection line from a side surface of the first light emitting cell, wherein the interconnection line includes a first connection portion electrically connected to the first light emitting cell and a second connection portion electrically connected to the second light emitting cell, one surface of the lower semiconductor layer includes an exposed region through which the lower semiconductor layer is exposed, the first connection portion contacts the first transparent electrode layer, the second connection portion is electrically connected to the lower semiconductor layer of the second light emitting cell through the exposed region, operation of each of the plurality of multi-cell light emitting diodes is independently controlled, and light emitted through the at least one first optical member has a beam angle $\theta_{Lens}$ as represented by Equation 2.

$$\theta_{Lens} > 2\tan^{-1}\left(\frac{FWHM_{LED}}{2OD}\right) \qquad [\text{Equation 2}]$$

wherein $FWHM_{LED}$ is the full width at half maximum of light emitted from the multi-cell light emitting diode without the first optical member and OD is a distance from a bottom surface of the multi-cell light emitting diode to a bottom surface of a diffusive plane.

A portion of the first transparent electrode layer may be connected to the second light emitting cell and may extend from an upper surface of the first light emitting cell to a side surface of the lower semiconductor layer of the second light emitting cell through a space between the first light emitting cell and the second light emitting cell.

A portion of the first transparent electrode layer disposed on the side surface of the lower semiconductor layer of the second light emitting cell may have a larger width than a portion of the interconnection line disposed on the side surface of the lower semiconductor layer of the second light emitting cell.

A portion of the first transparent electrode layer disposed between the first light emitting cell and the second light emitting cell may have a larger width than a portion of the interconnection line disposed between the first light emitting cell and the second light emitting cell.

The first transparent electrode layer may separate the interconnection line and the insulation layer from each other.

A portion of the insulation layer may be disposed on a portion between the first light emitting cell and the second light emitting cell on the growth substrate.

The multi-cell light emitting diode may further include a current blocking layer disposed between the first light emitting cell and the first transparent electrode layer and separating a portion of the first transparent electrode layer from the first light emitting cell.

The first transparent electrode layer may be disposed between the second connection portion and the lower semiconductor layer of the second light emitting cell.

According to exemplary embodiments, since the backlight unit employs light emitting diodes emitting light having a large beam angle and a high luminous flux, the backlight unit can have a reduced size and emit light having the same level of luminous intensity through a smaller number of light emitting diodes than a typical backlight.

In addition, the backlight unit includes a light emitting diode package including a plurality of light emitting diodes connected to each other in series, thereby preventing deterioration in performance due to a droop phenomenon of the light emitting diodes under high current conditions.

Further, the backlight module may be composed of MJT LEDs having low-current driving characteristics, thereby achieving an effect of allowing the backlight module and the backlight unit including the same to be driven with low current.

Furthermore, it is possible to improve stability and reliability of a drive circuit for controlling operation of the backlight module while reducing manufacturing costs.

Furthermore, it is possible to improve power efficiency and luminous efficacy of the backlight unit while preventing a droop phenomenon resulting from high-current driving.

Furthermore, it is possible to minimize the number of LEDs constituting the backlight module and to allow each of the MJT LEDs constituting the backlight module to be independently controlled.

Furthermore, at least one of connection portions of an interconnection line may be electrically connected to an inclined side surface of each light emitting cell, thereby increasing an effective luminous area of each of the light emitting cells of an MJT LED chip.

Furthermore, the backlight unit may include an optical member covering a plurality of multi-cell light emitting diodes and configured to allow light having passed therethrough to have a full width at half maximum in a predetermined range, thereby allowing light to be uniformly emitted from the backlight unit.

Furthermore, the backlight module may be composed of MJT LEDs having low-current driving characteristics, thereby achieving an effect of allowing the backlight module and the backlight unit including the same to be driven with low current. As a result, it is possible to reduce the number of discrete FETs.

BRIEF DESCRIPTION OF THE DRAWINGS

FIG. 3A is a plan view of a light emitting diode of the backlight unit according to the first exemplary embodiment of the disclosure.

DETAILED DESCRIPTION OF THE ILLUSTRATED EMBODIMENTS

Figure 1:
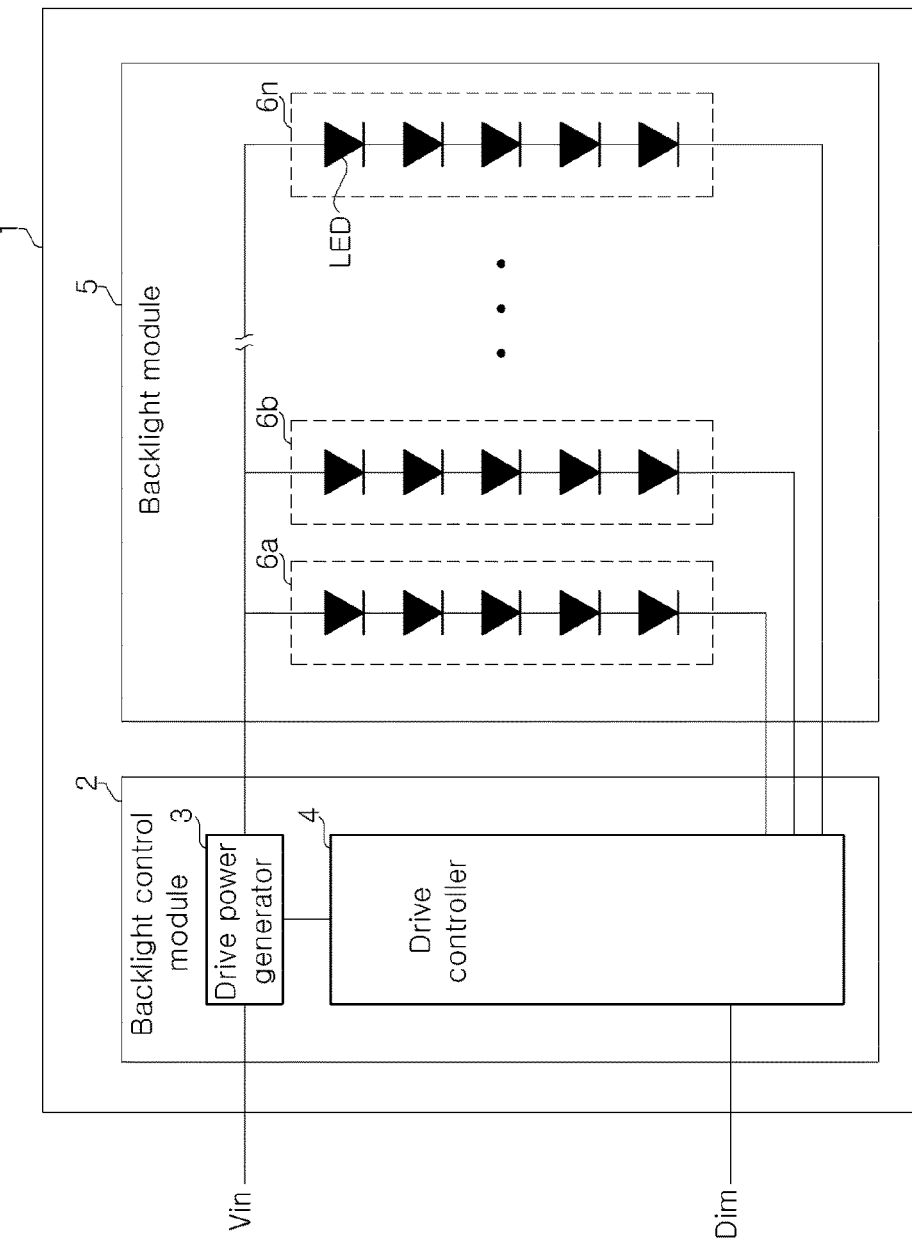
FIG. 1 is a schematic block diagram of a typical backlight unit using LEDs.

Hereinafter, exemplary embodiments of the disclosure will be described in detail with reference to the accompanying drawings. The following embodiments are provided by way of example so as to fully convey the spirit of the disclosure to those skilled in the art to which the disclosure pertains. Accordingly, the disclosure is not limited to the embodiments disclosed herein and can also be implemented in different forms. In the drawings, widths, lengths, thicknesses, and the like of elements can be exaggerated for clarity and descriptive purposes. Throughout the specification, like reference numerals denote like elements having the same or similar functions.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
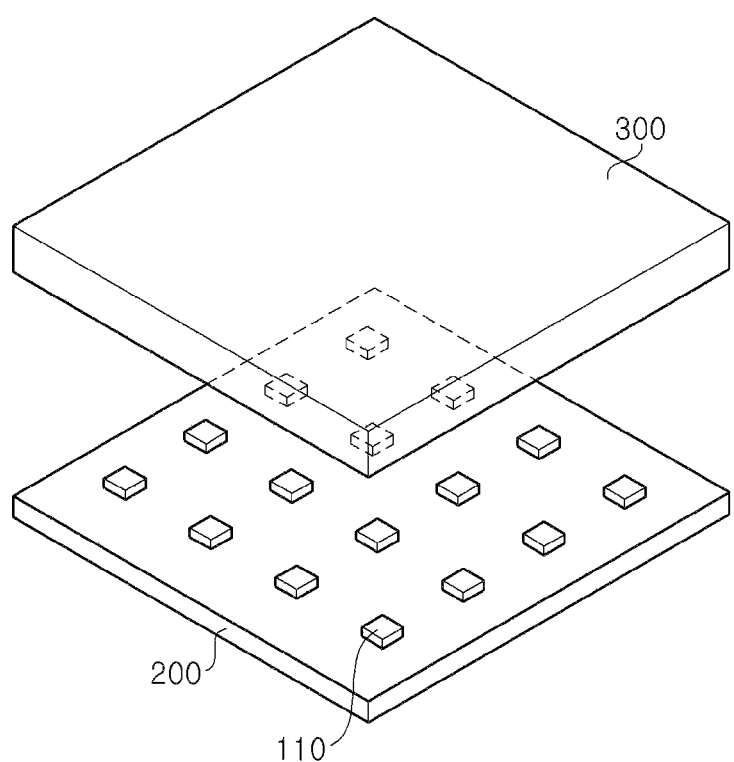
FIG. 2 is a perspective view of a backlight unit constructed according to a first exemplary embodiment of the disclosure.

FIG. 2 is a perspective view of a backlight unit according to a first exemplary embodiment of the disclosure.

Referring to FIG. 2, the backlight unit includes a base 200 and a light emitting diode package 110.

The base 200 supports the light emitting diode package 110. The base 200 may include an interconnection line (not shown). For example, the base 200 may include a printed circuit board (not shown).

The light emitting diode package 110 may be disposed on the base 200. The backlight unit may include a plurality of light emitting diode packages 110. The plurality of light emitting diode packages 110 may be electrically connected to the interconnection line of the base 200 to receive electric current therethrough. For example, in the structure wherein the base 200 includes the printed circuit board, the light emitting diode packages 110 may be electrically connected to the printed circuit board.

The backlight unit may further include a diffusive plate 300. The diffusive plate 300 may be disposed on the light emitting diode packages 110. Furthermore, the diffusive plate 300 may be separated from the base 200. The diffusive plate 300 serves to diffuse light emitted from the light emitting diode packages 110 such that a display such as a liquid crystal display can provide uniform color and brightness.

According to this exemplary embodiment, the backlight unit may be a direct type backlight unit configured to allow light emitted from the light emitting diode packages 110 to enter a lower surface of the diffusive plate 300 at a right angle or an edge type backlight unit configured to allow light emitted from the light emitting diode packages 110 to enter a side surface of a light guide plate (not shown) at a right angle. For the edge type backlight unit, since a light exit plane of each of the light emitting diode packages 110 is disposed to face the side surface of the light guide plate, the base 200 has a partially bent shape and the light emitting diode packages 110 may be disposed on one surface of the base facing the side surface of the light guide plate.

In a light emitting diode according to exemplary embodiments of the disclosure, components of the light emitting diode are grown in a direction towards the base 200. Specifically, the light emitting diode may be formed such that a lower surface of the base 200 faces an upper surface of the light emitting diode. That is, upper and lower sides of FIG. 2 are opposite to the upper and lower sides of FIG. 3 and FIG. 4. Thus, the light emitting diode packages 110 may also be disposed on the lower surface of the base 200 and the diffusive plate 300 may also be illustrated as being disposed below the light emitting diode package 110. Other components of the backlight unit of the exemplary embodiment will be described in accordance with this definition as to the upward and downward directions.

Figure 3B:
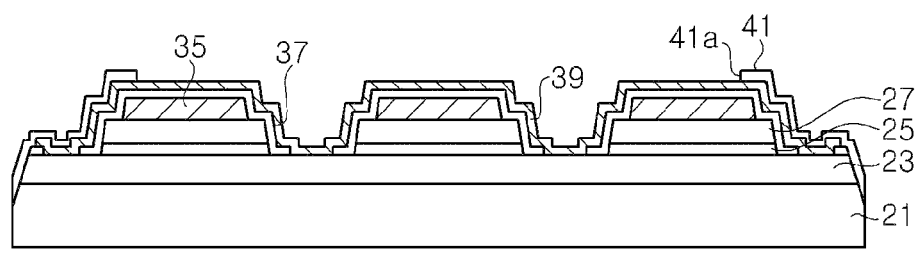
FIG. 3B is a cross-sectional view taken along line A-A in FIG. 3A.
Figure 3C:
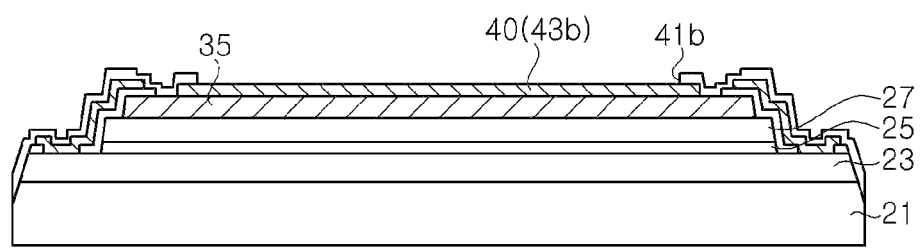
FIG. 3C is a cross-sectional view taken along line B-B in FIG. 3A.

FIG. 3 shows a light emitting diode of the backlight unit according to the first exemplary embodiment of the disclosure, in which (a) is a plan view, (b) is a cross-sectional view taken along line A-A, and (c) is a cross-sectional view taken along line B-B.

The light emitting diode includes a substrate 21, a first conductive type semiconductor layer 23, an active layer 25, a second conductive type semiconductor layer 27, reflective electrode structures 35, a lower insulation layer 37, a current spreading layer 39, an anti-diffusion reinforcement layer 40, and an upper insulation layer 41.

The first conductive type semiconductor layer 23, the active layer 25 and the second conductive type semiconductor layer 27 are grown on the substrate 21. The substrate 21 is a substrate that allows growth of a gallium nitride-based semiconductor layer thereon, and may include, for example, a sapphire substrate, a silicon carbide substrate, a gallium nitride (GaN) substrate, a spinel substrate, and the like. Particularly, the substrate 21 may be a patterned substrate such as a patterned sapphire substrate (PSS).

Here, the substrate 21 may be removed from light emitting diode chips before or after division into individual light emitting diode chips, but is not limited thereto. Alternatively, the substrate 21 may not be removed therefrom.

For example, the first conductive type semiconductor layer 23 may include an n-type GaN-based layer and the second conductive type semiconductor layer 27 may include a p-type GaN-based layer. Further, the active layer 25 may have a single quantum well structure or a multi-quantum well structure, and may include well layers and barrier layers. Compositional elements of the well layers may be selected depending upon a desired wavelength of light, and may include, for example, AlGaN, GaN or InGaN.

Each of the reflective electrode structures 35 may include a reflective metal layer, a capping metal layer, and an anti-oxidation metal layer. The reflective metal layer may include a reflective layer and a stress relief layer interposed between the reflective metal layer and the capping metal layer. The stress relief layer relieves stress caused by a difference in coefficient of thermal expansion between the reflective metal layer and the capping metal layer.

The reflective metal layer may be formed of, for example, Ni/Ag/Ni/Au, and has a total thickness of about 1600 Å. Alternatively, the reflective metal layer may be composed of Ni/Ag, ITO/Ag or ITO/DBR layers (DBR: distributed Bragg reflector). As shown in the drawing, the reflective metal layer may have an inclined side surface such that a bottom surface of the reflective metal layer has a larger area than an upper surface thereof. Such a reflective metal layer may be formed by e-beam evaporation.

The capping metal layer covers upper and side surfaces of the reflective metal layer to protect the reflective metal layer. The capping metal layer may be formed by sputtering or e-beam evaporation (for example, planetary e-beam evaporation) in which vacuum deposition is performed while rotating the substrate 21 in a slanted state. The capping metal layer may include Ni, Pt, Ti, or Cr, and may be formed by, for example, depositing about 5 pairs of Ni/Pt layers or about 5 pairs of Ni/Ti layers. Alternatively, the capping metal layer may include TiW, W, or Mo.

Material for the stress relief layer may be selected in various ways depending upon the metal of the reflective layer and the capping metal layer. For example, when the reflective layer includes Al or Al alloys and the capping metal layer includes W, TiW or Mo, the stress relief layer may be a single layer of Ag, Cu, Ni, Pt, Ti, Rh, Pd or Cr, or a composite layer of Cu, Ni, Pt, Ti, Rh, Pd or Au. Alternatively, when the reflective layer includes Al or Al alloys and the capping metal layer includes Cr, Pt, Rh, Pd or Ni, the stress relief layer may be a single layer of Ag or Cu, or a composite layer of Ni, Au, Cu or Ag.

Alternatively, when the reflective layer includes Ag or Ag alloys and the capping metal layer includes W, TiW or Mo, the stress relief layer may be a single layer of Cu, Ni, Pt, Ti, Rh, Pd or Cr, or a composite layer of Cu, Ni, Pt, Ti, Rh, Pd, Cr or Au. Alternatively, when the reflective layer includes Ag or Ag alloys and the capping metal layer includes Cr or Ni, the stress relief layer may be a single layer of Cu, Cr, Rh, Pd, TiW or Ti, or a composite layer of Ni, Au or Cu.

Further, the anti-oxidation metal layer may include Au in order to prevent oxidation of the capping metal layer and may be formed of, for example, Au/Ni or Au/Ti. Ti is preferred due to good adhesion with respect to an oxide layer such as $SiO_2$. The anti-oxidation metal layer may be formed by sputtering or e-beam evaporation (for example, planetary e-beam evaporation) in which vacuum deposition is performed while rotating the substrate 21 in a slanted state.

In addition, mesas may be disposed on the first conductive type semiconductor layer 23. Each of the mesas includes the active layer 25 and the second conductive type semiconductor layer 27. The active layer 25 is interposed between the first conductive type semiconductor layer 23 and the second conductive type semiconductor layer 27. The reflective electrode structures 35 are disposed on the mesas, respectively.

The lower insulation layer 37 may be formed by chemical vapor deposition (CVD) or the like, and may be an oxide layer such as $SiO_2$, a nitride layer such as SiNx, or an insulation layer such as $MgF_2$. The lower insulation layer 37 may have a thickness of, for example, 4,000 Å to 12,000 Å. The lower insulation layer 37 may be composed of a single layer or multiple layers. Furthermore, the lower insulation layer 37 may be a distributed Bragg reflector (DBR) in which low reflectivity material layers and high reflectivity material layers are stacked one above another. For example, an insulating reflective layer having high reflectance may be formed by stacking $SiO_2/TiO_2$ layers or $SiO_2/Nb_2O_5$ layers.

The lower insulation layer 37 may include openings 37a that expose the first conductive type semiconductor layer 23 and openings 37b that expose the reflective electrode structures 35. The openings 37b are restrictively disposed on each of the mesas, particularly, on a connecting portion of the mesa.

The current spreading layer 39 covers the mesas and the first conductive type semiconductor layer 23. The current spreading layer 39 may be disposed on upper surfaces of the mesas and has an opening that exposes the reflective electrode structures 35. The current spreading layer 39 may form ohmic contact with the first conductive type semiconductor layer 23 through the openings 37a of the lower insulation layer 37. The current spreading layer 39 is insulated from the mesas and reflective electrodes 35 by the lower insulation layer 37.

The opening of the current spreading layer 39 has a wider area than the openings 37b of the lower insulation layer 37 in order to prevent the current spreading layer 39 from contacting the reflective electrode structures 35. Thus, the opening of the current spreading layer 39 has a sidewall placed on the lower insulation layer 37.

The current spreading layer 39 is formed over substantially the entire upper surface of the substrate excluding the opening of the current spreading layer 39. Thus, electric current can be easily distributed through the current spreading layer 39.

The current spreading layer 39 includes an ohmic contact layer, a reflective metal layer, an anti-diffusion layer, and an anti-oxidation layer. The current spreading layer 39 may form ohmic contact with the first conductive type semiconductor layer 23 through the ohmic contact layer. For example, the ohmic contact layer may be formed of Ti, Cr, Ni, or the like. Meanwhile, the reflective metal layer increases reflectance of the light emitting diode by reflecting light entering the current spreading layer. The reflective metal layer may be formed of Al. Further, the anti-diffusion layer protects the reflective metal layer by preventing diffusion of metal atoms. Particularly, the anti-diffusion layer can prevent diffusion of metal atoms in solder pastes such as Sn. The anti-diffusion layer may include Cr, Ti, Ni, Mo, TiW, W or a combination thereof. The anti-diffusion layer may be a single layer of Mo, TiW or W. In some exemplary embodiments, the anti-diffusion layer may be composed of pairs of Cr, Ti, or Ni layers. Particularly, the anti-diffusion layer may include at least two pairs of Ti/Ni or Ti/Cr layers. Meanwhile, the anti-oxidation layer is formed to prevent oxidation of the anti-diffusion layer and may include Au.

The current spreading layer 39 may have a reflectance of 65% to 75%. Accordingly, light reflection can be performed by the reflective electrode structures 35 and the current spreading layer 39 such that light traveling along the sidewalls of the mesas and the first conductive type semiconductor layer 23 can be reflected thereby.

The current spreading layer 39 may further include a bonding layer on the anti-oxidation layer. The bonding layer may include Ti, Cr, Ni or Ta. The bonding layer may be used in order to improve bonding strength of the current spreading layer 39 to the upper insulation layer 41, or may be omitted.

For example, the current spreading layer 39 may have a multilayer structure of Cr/Al/Ni/Ti/Ni/Ti/Au/Ti.

The anti-diffusion reinforcement layer 40 may be separated from the current spreading layer 39. The anti-diffusion reinforcement layer 40 may be disposed in the openings 39a of the current spreading layer 39 and may also be disposed in the openings 37b of the lower insulation layer 37.

The upper insulation layer 41 is disposed on the current spreading layer 39. The upper insulation layer 41 has an opening 41a which exposes the current spreading layer 39 to define a first electrode pad region 43a, and an opening 41b which exposes the reflective electrode structures 35 to define a second electrode pad region 43b. The opening 41a may have an elongated shape extending in a vertical direction with respect to branches of the mesa. The opening 41b of the upper insulation layer 41 has a narrower area than the opening 39a of the current spreading layer 39 and thus the upper insulation layer 41 can cover the sidewall of the opening 39a.

In the structure wherein the anti-diffusion reinforcement layer 40 is formed on the reflective electrode structures 35, the opening 41b exposes the anti-diffusion reinforcement layer 40. In this structure, the reflective electrode structures 35 can be sealed by the upper insulation layer 41 and the anti-diffusion reinforcement layer 40.

Further, the upper insulation layer 41 may be formed in a chip isolation region to cover a side surface of the first conductive type semiconductor layer 23. Accordingly, it is possible to prevent moisture from entering through upper and lower interfaces of the first conductive type semiconductor layer 23.

The upper insulation layer 41 may be formed of silicon nitride in order to prevent diffusion of metal elements of solder pastes and may have a thickness of 1 μm to 2 μm. If the thickness of the upper insulation layer is less than 1 μm, it is difficult for the upper insulation layer 41 to prevent diffusion of the metal elements of the solder pastes.

Selectively, an anti-Sn diffusion layer (not shown) may be further formed on the first electrode pad region 43a and the second electrode pad region 43b by an electroless plating technique such as ENIG (electroless nickel immersion gold).

The first electrode pad region 43a is electrically connected to the first conductive type semiconductor layer 23 through the current spreading layer 39 and the second electrode pad region 43b is electrically connected to the second conductive type semiconductor layer 27 through the anti-diffusion reinforcement layer 40 and the reflective electrode structures 35.

The first electrode pad region 43a and the second electrode pad region 43b are used to mount the light emitting diode on a printed circuit board through solder pastes. Accordingly, in order to prevent the first electrode pad region 43a and the second electrode pad region 43b from being short-circuited by the solder pastes, a distance between electrode pads may be about 300 μm or more.

Figure 4:
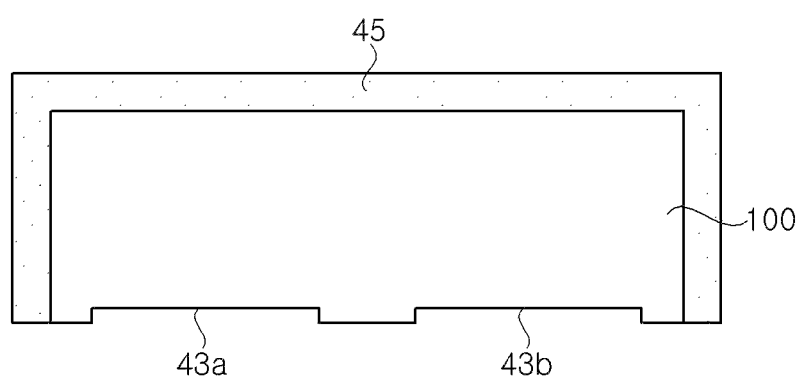
FIG. 4 is a cross-sectional side view of a wavelength conversion layer formed on the light emitting diode according to the first exemplary embodiment of the disclosure.

FIG. 4 is a side sectional view of a wavelength convertor formed on the light emitting diode according to the first exemplary embodiment of the disclosure.

A wavelength convertor 45 may have a uniform thickness covering an upper surface of a light emitting diode 100. For example, the wavelength convertor 45 may have a uniform thickness covering a lower surface of the first conductive type semiconductor layer 23. Alternatively, in the structure wherein the light emitting diode 100 includes the substrate 21, the wavelength convertor 45 may cover a lower surface of the substrate 21. The wavelength convertor 45 may be formed by coating a phosphor-containing resin on the light emitting diode 100 by printing or coating phosphor powder onto the substrate 21 using an aerosol spray apparatus. Particularly, a phosphor layer can be uniformly formed on the light emitting diode through aerosol deposition, whereby light emitted from the light emitting diode 100 can have improved color uniformity. Furthermore, the wavelength convertor 45 extends from the lower surface of the first conductive type semiconductor layer 23 to cover a side surface of the light emitting diode 100. Accordingly, wavelength conversion can be achieved with respect to light emitted through the side surface of the light emitting diode 100.

The wavelength convertor 45 may have a structure wherein phosphors are contained in a resin, but is not limited thereto. Alternatively, the wavelength convertor 45 may have a structure wherein the phosphors are contained in glass or a separate ceramic material.

In some exemplary embodiments, the wavelength convertor 45 may be composed only of phosphors without including the aforementioned resin, glass or separate ceramic material. In these embodiments, since it is possible to remove light absorption by the resin, glass or separate ceramic material, it is possible to improve light extraction efficiency. Further, since the thickness of the wavelength convertor 45 can be reduced, the size of the light emitting diode or the backlight unit can be reduced while further improving light extraction efficiency. In other exemplary embodiments, the wavelength convertor 45 may be composed only of single crystal phosphors. According to these embodiments, together with the aforementioned effects, the backlight unit can be adjusted to allow light to be concentrated in a desired beam angle and the degree of wavelength conversion by the phosphors can be uniformly exhibited depending upon a specific direction.

The light emitting diode may further include a bonding layer (not shown) between the wavelength convertor 45 and the first conductive type semiconductor layer 23. The bonding layer exhibits strong bonding strength with respect to each of the wavelength convertor 45 and the first conductive type semiconductor layer 23. As a result, the wavelength convertor 45 can be prevented from being separated from the first conductive type semiconductor layer 23.

Figure 5A:
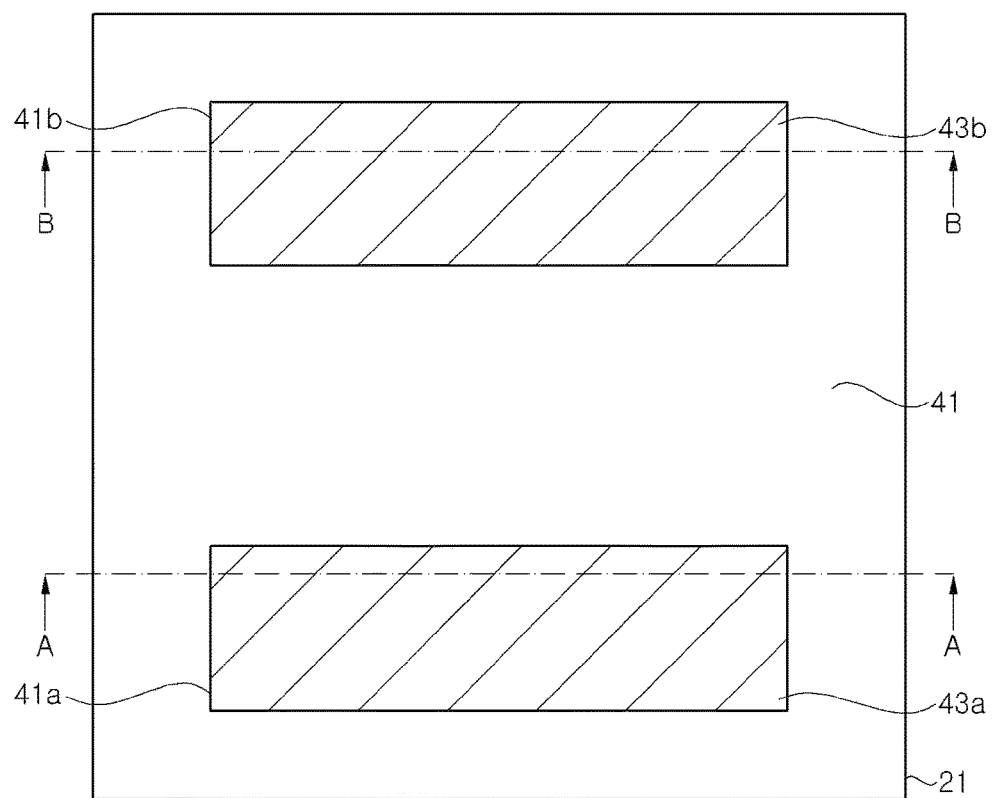
FIG. 5A is a plan view of a light emitting diode of a backlight unit according to a second exemplary embodiment of the disclosure.
Figure 5B:
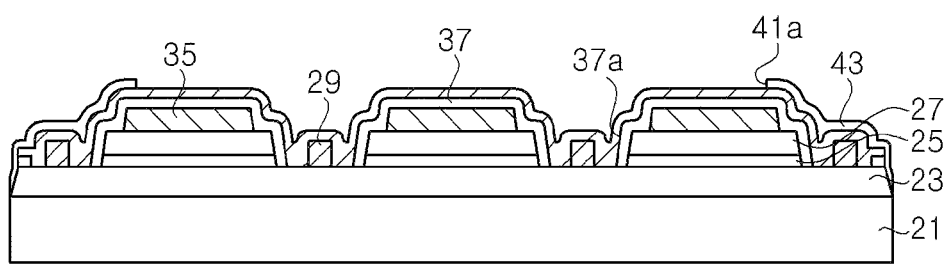
FIG. 5B is a cross-sectional view taken along line A-A in FIG. 5A.
Figure 5C:
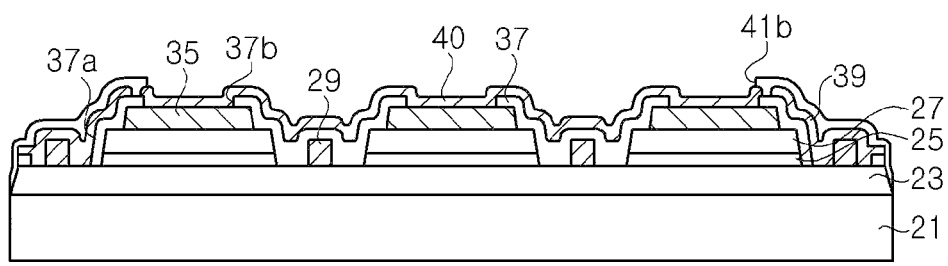
FIG. 5C is a cross-sectional view taken along line B-B in FIG. 5A.

FIG. 5 shows a light emitting diode of a backlight unit according to a second exemplary embodiment of the disclosure, in which (a) is a plan view, (b) is a cross-sectional view taken along line A-A, and (c) is a cross-sectional view taken along line B-B.

The light emitting diode according to this exemplary embodiment includes a substrate 21, a first conductive type semiconductor layer 23, an active layer 25, a second conductive type semiconductor layer 27, reflective electrode structures 35, ohmic contact structures 29, a lower insulation layer 37, a current spreading layer 39, an anti-diffusion reinforcement layer 40, and an upper insulation layer 41. Descriptions of the same components of this exemplary embodiment as those of the first exemplary embodiment will be omitted.

The ohmic contact structures 29 are formed on the first conductive type semiconductor layer 23. The ohmic contact structures 29 may be formed between mesas and on edges in the longitudinal direction of the mesas. The ohmic contact structures 29 are formed of a material capable of forming ohmic contact with the first conductive type semiconductor layer 23 and may include, for example, Ti/Al. Particularly, for a UV light emitting diode, the ohmic contact structures may have a stack structure of Ti/Al/Ti/Au.

In this exemplary embodiment, the plural ohmic contact structures 29 are illustrated as being separated from each other. Alternatively, a single ohmic contact structure 29 may be formed on the first conductive type semiconductor layer 23.

In this exemplary embodiment, openings 37a exposing the first conductive type semiconductor layer 23 also expose the ohmic contact structures 29.

Meanwhile, among the ohmic contact structures 29, the ohmic contact structures 29 disposed on the edges of the substrate 21 can be entirely exposed through the openings 37a. However, in the ohmic contact structures 29 disposed between the mesas M, regions exposed to the openings 37a are spaced apart from regions between the openings 37a in order to prevent a short-circuit between the ohmic contact structures 29 and the reflective electrode structures 35.

The current spreading layer 39 is electrically connected to the ohmic contact structures 29 and the first conductive type semiconductor layer 23 through the openings 37a of the lower insulation layer 37. The ohmic contact structures 29 separated from each other may be electrically connected to each other through the current spreading layer 39. Further, the current spreading layer 39 may cover side surfaces of the ohmic contact structures 29, whereby light entering the side surfaces of the ohmic contact structures 29 can be reflected by the current spreading layer 39.

The current spreading layer 39 covers substantially the entire upper region of the substrate 21 and thus has low resistance, thereby facilitating current spreading to the ohmic contact structures 29.

In this exemplary embodiment, the anti-diffusion reinforcement layer 40 is separated from the current spreading layer 39 and is connected to the reflective electrode structures 35 exposed through the openings 37b. The reflective electrode structures 35 separated from each other by the anti-diffusion reinforcement layer 40 may be electrically connected to each other. The anti-diffusion reinforcement layer 40 is insulated from the ohmic contact structures 29 by the lower insulation layer 37.

In order to prevent light loss, the current spreading layer 39 and the anti-diffusion reinforcement layer 40 cover 80% or more the total chip area.

Figure 6:
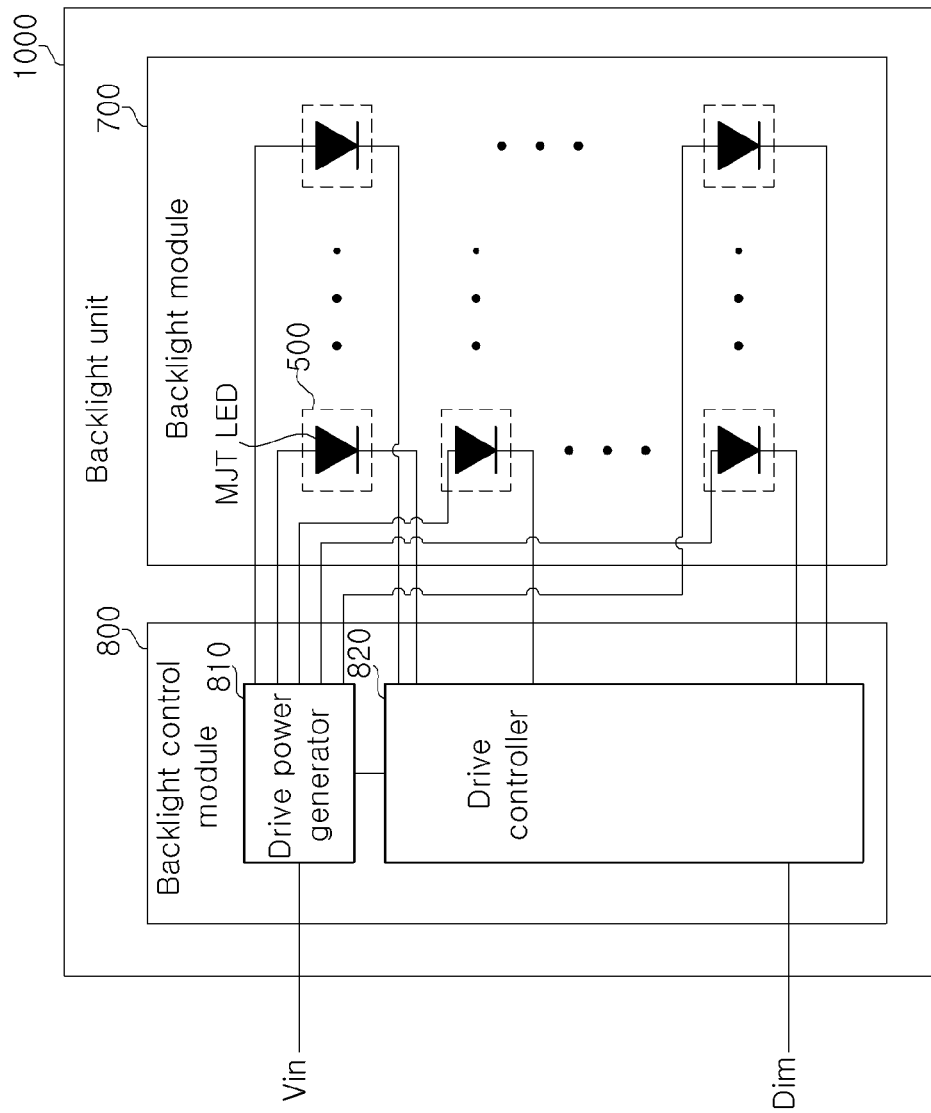
FIG. 6 is a schematic block diagram of a backlight unit using MJT LEDs according to a third exemplary embodiment of the disclosure.

FIG. 6 is a schematic block diagram of a backlight unit using MJT LEDs according to a third exemplary embodiment of the disclosure.

Herein, the term "MJT LED chip" means a multi-cell LED chip in which plural light emitting cells are connected to each other via interconnection lines. The MJT LED chip may include N light emitting cells (N being an integer of 2 or more), and N may be set in various ways, as needed. Preferably, each of the light emitting cells has a forward voltage of 3 V to 3.6 V, without being limited thereto. Accordingly, the forward voltage of the MJT LED chip (or MJT LED) is proportional to the number of light emitting cells included in the corresponding MJT LED chip.

Here, since the number of light emitting cells included in the corresponding MJT LED chip is set in various ways as needed, the MJT LED chip according to the exemplary embodiment may have a drive voltage of 6 V to 36 V according to specifications of a drive power generator (for example, DC convertor) used in the backlight unit, without being limited thereto. Further, drive voltage of the MJT LED chip is much smaller than a typical single-cell LED and may range, for example, from 20 mA to 40 mA, without being limited thereto.

Further, "MJT LED" refers to a light emitting device or an LED package including the MJT LED chip according to exemplary embodiments of the disclosure.

Further, "MJT LED module" refers to an assembly of one MJT LED and one optical member corresponding thereto. The optical member may be directly disposed on the MJT LED, or may be disposed on a printed circuit board on which the MJT LED is mounted. Irrespective of disposition of the optical member, an assembly of one MJT LED and one optical member corresponding thereto is referred to as an MJT LED module.

Further, the term "backlight module" refers to an illumination module in which a plurality MJT LEDs is disposed on a printed circuit board and optical members are disposed corresponding to the MJT LEDs, respectively. Thus, the term "backlight module" may mean an illumination module in which a plurality of MJT LED modules is mounted on the printed circuit board according to a predetermined regulation.

On the other hand, the backlight module according to this exemplary embodiment may be a direct type backlight module, but is not limited thereto. In other exemplary embodiments, the backlight module may be used as a light source for sheet illumination. Thus, it will be apparent to those skilled in the art that despite terminology thereof, a component including technical features of the backlight module according to the exemplary embodiments of the disclosures falls within the scope of the disclosure.

Before detailed description of the backlight unit according to the exemplary embodiment of the disclosure, main features of the backlight unit according to the exemplary embodiment will be described. The backlight unit according to the exemplary embodiment has been conceived in light of device characteristics of an MJT LED in order to overcome the aforementioned problems of a typical backlight unit in the art. That is, in order to resolve the problems caused by low voltage-high current driving characteristics of a typical single-cell LED in the art, the backlight unit according to the exemplary embodiment was developed based on high voltage-low current driving characteristics of the MJT LED (for example, a drive voltage of 6 V to 36 V and a drive current of 20 mA to 40 mA).

As described above, unlike a typical single-cell LED known in the art, the MJT LED may include a certain number of light emitting cells and has a forward voltage which varies depending upon the number of light emitting cells therein. Further, since the MJT LED includes a plurality of light emitting cells, the MJT LED can illuminate a wider region than the typical single-cell LED, and since the MJT LED is composed of a single MJT LED chip, design and application of an optical member to the MJT LED can be easily achieved.

Accordingly, among isolation regions of a liquid crystal panel, one isolation region can be covered by one MJT LED module (MJT LED+optical member). Thus, the number of LEDs constituting the backlight module can be reduced as compared with the typical single-cell LED. Conclusively, for the backlight unit according to exemplary embodiment, the backlight module is constituted using a plurality of MJT LED modules and each of MJT LEDs constituting the backlight module is independently controlled, thereby achieving objects of the exemplary embodiment.

Referring to FIG. 6, a backlight unit 1000 according to this exemplary embodiment includes a backlight control module 800 and a backlight module 700. The backlight unit according to this exemplary embodiment may further include field effect transistors (FETs) (not shown) and a light transmitting plate (not shown).

More specifically, the backlight control module 800 according to this exemplary embodiment includes a drive power generator 810 configured to generate/output DC drive power using an input voltage Vin supplied from an external power source and a drive controller 820 configured to control (On/Off control and dimming control) each of a plurality of MJT LEDs 500 constituting the backlight module 700. Generally, the drive power generator 810 is configured to generate a stable DC voltage of 12 V, 24 V, 48 V, and the like as a drive power and to supply the drive power to the plurality of MJT LEDs 500 constituting the backlight module 700. Here, the input voltage Vin supplied to the drive power generator 810 may be a commercial alternating voltage of 220 V or 110 V. Such a drive power generator 810 may have substantially the same structure as the typical drive power generator 810, as shown in FIG. 1.

The backlight module 700 according to this exemplary embodiment may be constituted by arranging the plurality of MJT LEDs 500 and optical members (not shown in FIG. 6) corresponding to the MJT LEDs 500, respectively, in a regular manner (for example, in a matrix) on a printed circuit board (not shown in FIG. 6).

Figure 9:
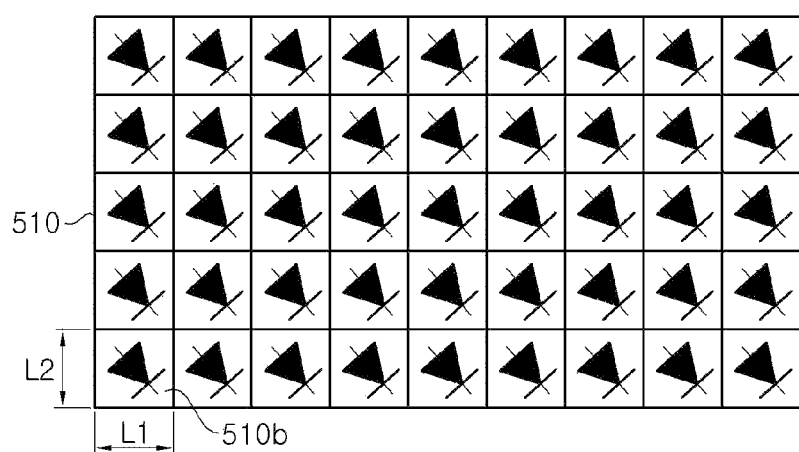
FIG. 9 is a schematic view of the backlight unit according to the third exemplary embodiment of the disclosure.

FIG. 9 is a schematic view of the backlight unit according to the exemplary embodiment of the disclosure. Referring to FIG. 9, a printed circuit board 510 may include a plurality of blocks 510b. Each of the blocks 510b means a partial region of the printed circuit board including a region in which each of the MJT LEDs is mounted upon mounting the plurality of MJT LEDs on the printed circuit board. Specifically, one block 510b may include at least one MJT LED. More specifically, one block 510b may include one MJT LED, but is not limited thereto. Alternatively, one block 510b may include a plurality of MJT LEDs.

The plurality of blocks 510b may be arranged to constitute an M×N matrix, in which M blocks are arranged in the longitudinal direction and N blocks are arranged in the transverse direction. Referring to FIG. 9, for example, 45 blocks 510b may be arranged in a 9×5 matrix. Each of the blocks 510b may have a longitudinal length L1 of 60 mm or less. In addition, each of the blocks 510b may have a transverse length L2 of 55 mm or less.

In the exemplary embodiment shown in FIG. 6, assuming that, in the backlight module 700, M MJT LEDs 500 are arranged in the longitudinal direction and N MJT LEDs 500 are arranged in the transverse direction to constitute the M×N matrix. Here, each of the MJT LEDs may be placed in one-to-one correspondence to each of the blocks. In addition, an MJT LED placed at the left uppermost end is referred to as a 1-$1^{st}$ MJT LED 500_11 and an MJT LED placed at the right-lowermost end is referred to as an M-$N^{th}$ MJT LED 500_MN.

Here, it should be noted that, unlike the typical backlight unit shown in FIG. 1, each of the MJT LEDs 500 in the backlight module 700 according to the exemplary embodiment shown in FIG. 6 is independently connected to the drive power generator 810 and the drive controller 820 instead of being connected to each other in series, in parallel or in series/parallel. That is, in the exemplary embodiment shown in FIG. 6, an anode of each of the MJT LEDs 500 is independently connected to the drive power generator 810 and a cathode of each of the MJT LEDs 500 is independently connected to the drive controller 820. In the structure wherein each MJT LED is disposed in one-to-one correspondence to each block, each block may be independently connected to the drive power generator 810 and the drive controller 820.

With this structure, the drive controller 820 according to this exemplary embodiment can independently control operation of each of the MJT LEDs 500 constituting the backlight module 700. More specifically, the drive controller 820 according to this exemplary embodiment is configured to control the dimming level of a certain MJT LED among the plurality of MJT LEDs 500 in response to a dimming signal. In the structure wherein each of the MJT LEDs is disposed in one-to-one correspondence to each of the blocks, the drive controller 820 can independently control operation of each of the plurality of blocks.

The drive controller 820 according to this exemplary embodiment includes a Pulse Width Modulation (PWM) control unit (not shown) and may be configured to perform dimming control through PWM control of drive power supplied to a certain MJT LED, which is a dimming control target among the MJT LEDs 500. Particularly, unlike the typical backlight unit shown in FIG. 1, the backlight unit 1000 according to this exemplary embodiment shown in FIG. 6 is configured such that each of the MJT LEDs 500 is independently connected to the drive power generator 810 and independently receives a drive power. With this structure, the drive control can perform dimming control through PWM. Specifically, the drive controller 820 can control the duty ratio of the drive power in the range of 0 to 100%.

For example, when there is a need for dimming control with respect to the 1-$1^{st}$ MJT LED 500_11, the drive controller 820 controls the drive power to have a certain duty ratio (for example, 60%) through pulse width modulation in response to a dimming signal Dim and supplies the drive power subjected to pulse width modulation to the 1-$1^{st}$ MJT LED 500_11, thereby performing dimming control with respect to the 1-$1^{st}$ MJT LED 500_11. Here, a drive power not subjected to pulse width modulation and having a duty ratio of 100% will be supplied to other MJT LEDs excluding the 1-$1^{st}$ MJT LED 500_11. Alternatively, a drive power subjected to pulse width modulation to have a normal duty ratio (fundamental duty ratio, for example, 80%, when there is no separate dimming control) will be supplied to other MJT LEDs excluding the 1-$1^{st}$ MJT LED 500_11.

Accordingly, local dimming control can be performed only with respect to the 1-$1^{st}$ MJT LED 500_11. Obviously, it will be apparent to those skilled in the art that the plurality of MJT LEDs can be simultaneously subjected to dimming control through PWM control to have the same dimming level and/or different dimming levels. The drive power may be a DC drive voltage. A PWM control unit for performing PWM control of the drive power is known in the art and thus a detailed description thereof will be omitted.

As needed, the drive controller 820 according to this exemplary embodiment may include a drive current detector (not shown) and a drive current control unit (not shown) and may be configured to perform dimming control by controlling dimming current supplied to a certain MJT LED, which is a dimming control target among the MJT LEDs 500. Particularly, unlike the typical backlight unit shown in FIG. 1, in the backlight unit 1000 according to the exemplary embodiment of FIG. 6, each of the MJT LEDs 500 is independently connected to the drive controller 820. Thus, it is possible to perform dimming control by controlling the dimming current for each of the MJT LEDs in the above manner.

In the drive controller 820, the drive current detector and the drive current control unit are provided in one-to-one correspondence to each of the MJT LEDs 500. Thus, in the structure wherein the backlight module 700 is composed of M×N MJT LEDs 500, the drive controller 820 includes M×N drive current detectors and M×N drive current control units. For example, when there is a need for dimming control with respect to the M-$N^{th}$ MJT LED 500_MN, the drive controller 820 detects a drive current flowing through the M-$N^{th}$ MJT LED 500_MN using the drive current detector and changes the drive current flowing through the M-$N^{th}$ MJT LED 500_MN (for example, to 100% of the maximum drive current) in response to a dimming signal Dim, thereby performing dimming control with respect to the M-$N^{th}$ MJT LED 500_MN.

For example, the drive controller 820 may control the drive current in the range of 0 to 100%. Here, since normal drive current (fundamentally preset drive current, for example, 80% of the maximum drive current, when there is no separate dimming control) flows through other MJT LEDs excluding the M-$N^{th}$ MJT LED 500_MN, it is possible to perform local dimming only with respect to the M-$N^{th}$ MJT LED 500_MN. Obviously, it will be apparent to those skilled in the art that the plurality of MJT LEDs can be simultaneously subjected to dimming control through drive current control to have the same dimming level and/or different dimming levels.

In this exemplary embodiment, since it is not necessary for each of the MJT LEDs 500 to independently receive the drive power, the anode of each of the MJT LEDs 500 may be connected to one drive power line connected to the drive power generator 810, unlike the exemplary embodiment shown in FIG. 6. The drive current detector and the drive current control unit are known in the art, and detailed descriptions thereof will be omitted herein.

The drive controller 820 according to this exemplary embodiment may include a plurality of switch controllers (not shown). Each of the switch controllers may be disposed between the MJT LEDs. Specifically, the switch controllers may be placed between one MJT LED and another MJT LED adjacent thereto. More specifically, the switch controllers may be placed between one MJT LED and other MJT LEDs. That is, the switch controllers may be placed between one MJT LED and other M×N-1 MJT LEDs among the M×N MJT LEDs, and this arrangement may be applied not only to the one MJT LED but also to all of the MJT LEDs included in the backlight module 700.

Each of the switch controllers may electrically connect two MJT LEDs connected by the switch controller, and may also electrically insulate two MJT LEDs from each other. Thus, the plurality of MJT LEDs may be connected to each other in series and/or in parallel through the switch controllers. Accordingly, a desired structure of the backlight module 700 can be easily realized.

Figure 10:
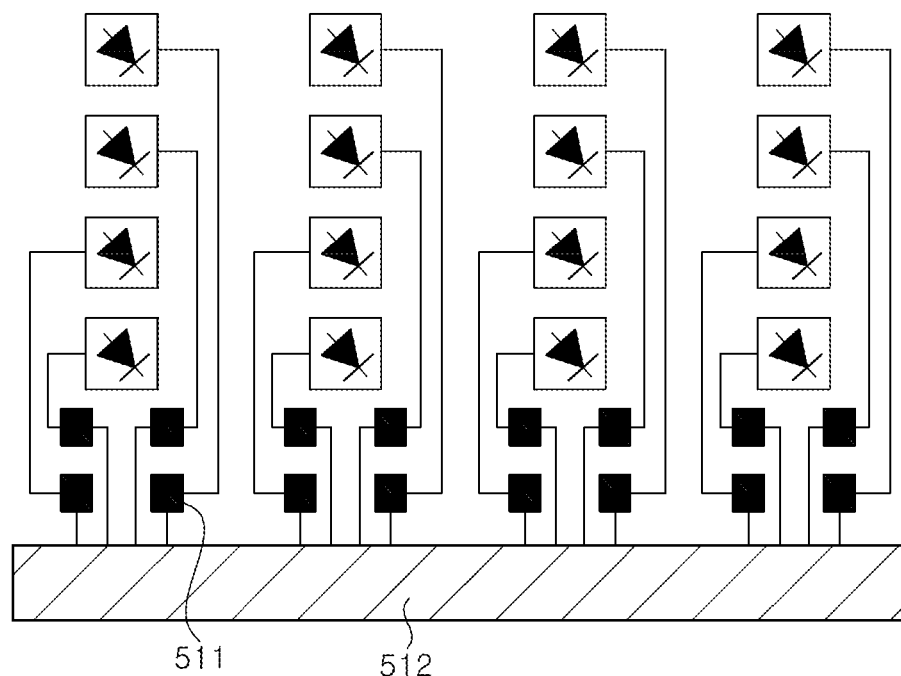
FIG. 10 is a perspective photograph of a backlight unit according to another exemplary embodiment of the disclosure.

Referring to FIG. 10, the backlight unit according to the exemplary embodiments may further include FETs 511. In the exemplary embodiments wherein the backlight unit includes the FETs 511, the backlight unit may include a FET controller 512 configured to control the FETs 511. The FET controller (drive IC) 512 senses a preset voltage and controls On/Off of the FETs 511 based on the detected preset voltage. For example, the preset voltage may be a voltage applied to a resistor (not shown) connected to one terminal of each of the FETs 511. When the FETs 511 are turned on, electric current is not applied to the MJT LEDs and when the FETs 511 are turned off, electric current can be applied to the MJT LEDs. As shown in FIG. 10, the FETs may be disposed on a lower surface of the printed circuit board, specifically, near a lower side of each of the MJT LEDs, without being limited thereto. Accordingly, arrangement of the FETs 511 may be the same as arrangement of the MJT LEDs, without being limited thereto. Alternatively, the arrangement of the MJT LEDs may be different from the arrangement of the FETs. The FET controller 512 may be disposed on the lower surface of the printed circuit board, but is not limited thereto.

The FETs 511 may be connected to the MJT LEDs. Specifically, the number of MJT LEDs may be the same as the number of FETs 511 and the MJT LEDs may be connected to the FETs 511 in one-to-one correspondence. For example, the number of MJT LEDs is 640 and 640 FETs 511 are respectively connected to the MJT LEDs in one-to-one correspondence.

The MJT LEDs according to exemplary embodiments can be driven with high voltage and low current. Since the MJT LEDs allowing low-current driving can be used together with the FETs 511 having relatively small capacitance, the FETs 511 according to the exemplary embodiments may be smaller than FETs 511 typically used in the art. Accordingly, since the backlight module according to the exemplary embodiments can employ a printed circuit board having a smaller size than a typical printed circuit board, it is possible to achieve miniaturization of the backlight module and reduction in manufacturing costs.

Further, since the FETs 511 can be miniaturized, at least some FETs 511 may be included in the FET controller 512 unlike a typical backlight unit in which the FET controller 512 is separated from the FETs 511. Furthermore, the FET controller 512 may include all of the FETs 511 used in the backlight unit. Accordingly, since the number of FETs 511 not included in the FET controller 512 can be reduced or there can be no FETs 511 outside the FET controller 512, it is possible to achieve miniaturization of the backlight module and reduction in manufacturing costs. For example, when there are 640 MJT LEDs, the number of FETs not included in the FET controller 512 may be smaller than 640. Accordingly, the size of the printed circuit board can be reduced to, for example, 70% or more.

The backlight unit according to this exemplary embodiment may further include a light transmitting plate (not shown). The light transmitting plate may be disposed above the backlight module 700. Specifically, the light transmitting plate may be disposed above the printed circuit board 510 of the backlight module 700. The light transmitting plate can serve to diffuse light emitted from the MJT LEDs of the backlight module 700. A distance between a lower surface of the light transmitting plate and an upper surface of the printed circuit board may be 18 mm or more.

Figure 7:
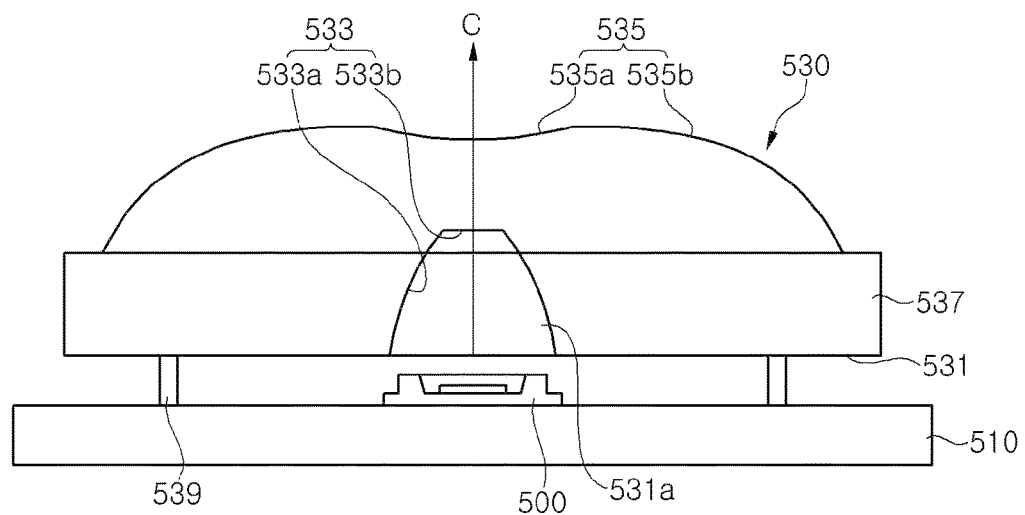
FIG. 7 is a cross-sectional view of an MJT LED module according to the third exemplary embodiment of the disclosure.
Figure 8:
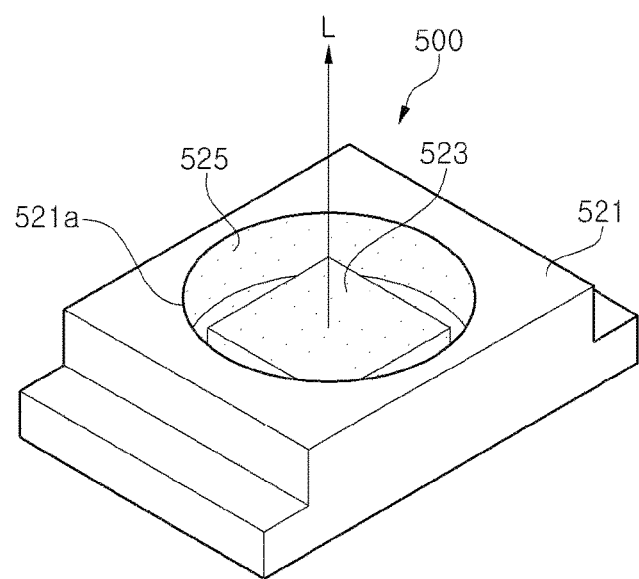
FIG. 8 is a perspective view of the MJT LED according to the third exemplary embodiment of the disclosure.

FIG. 7 is a schematic cross-sectional view of an MJT LED module according to one exemplary embodiment of the disclosure and FIG. 8 is a perspective view of an MJT LED used in the MJT LED. Hereinafter, details of an MJT LED 100 and an MJT LED module according to one exemplary embodiment of the disclosure will be described with reference to FIG. 7 and FIG. 8.

Referring to FIG. 7, the MJT LED module according to one exemplary embodiment includes an MJT LED 500 and an optical member 530. The MJT LED 500 is mounted on a printed circuit board 510 and the optical member 530 corresponding to the MJT LED 500 is mounted on the printed circuit board 510 so as to correspond to the MJT LED 500. For example, on the printed circuit board 510, each of blocks may include one optical member. As described above, in other exemplary embodiments, the optical member 530 may be directly connected to the MJT LED 100. Specifically, the optical member 530 may be formed by molding a resin on the MJT LED. Although some of the printed circuit board 510 is shown, a plurality of MJT LEDs 500 and optical members 530 corresponding to the plurality of MJT LEDs 500 may be arranged in various ways such as a matrix or honeycomb-shaped arrangement on one printed circuit board 510 to constitute the backlight module 700 as described above.

The printed circuit board 510 includes conductive land patterns formed on an upper surface thereof such that terminals of the MJT LEDs 500 are bonded to the conductive land patterns. Further, the printed circuit board 510 may include a reflective layer formed on the upper surface thereof. The printed circuit board 510 may be a metal-core PCB (MCPCB) based on a metal having good thermal conductivity. Alternatively, the printed circuit board 510 may be formed of an insulation substrate material such as FR4. Although not shown in the drawings, the printed circuit board 510 may be provided at a lower side thereof with a heat sink to dissipate heat generated from the MJT LEDs 500.

As clearly shown in FIG. 8, the MJT LED 500 includes a housing 521, an MJT LED chip 523 mounted on the housing 521, and a wavelength conversion layer 525 covering the MJT LED chip 523. The MJT LED 500 further includes lead terminals (not shown) supported by the housing 521.

The housing 521 constitutes a package body and may be formed by injection molding of a plastic resin such as PA or PPA. In this case, the housing 521 may be formed so as to support the lead terminals by injection molding and may have a cavity 521a for mounting the MJT LED chip 523 thereon. The cavity 521a defines a light exit region of the MJT LED 500.

The lead terminals are separated from each other within the housing 521 and extend outside the housing 521 so as to be bonded to the land patterns on the printed circuit board 510.

The MJT LED chip 523 is mounted on the bottom of the cavity 512a and is electrically connected to the lead terminals. The MJT LED chip 523 may be a GaN-based MJT LED which emits UV light or blue light. Details of the MJT LED chip 523 according to this exemplary embodiment will be described below.

The wavelength conversion layer 525 covers the MJT LED chip 523. The wavelength conversion layer 525 may be formed by mounting the MJT LED chip 523, followed by filling the cavity 512a with a molding resin containing phosphors. Here, the wavelength conversion layer 525 may fill the cavity 512a of the housing 521 and may have a substantially flat or convex upper surface. Further, a molding resin having a shape of an optical member may be further formed on the wavelength conversion layer 525.

The MJT LED chip 523 having a conformal phosphor coating layer thereon may be mounted on the housing 521, as needed. That is, a conformal coating layer of phosphors is formed on the MJT LED chip 523, and the MJT LED chip 523 including the conformal coating layer may be mounted on the housing 521. The MJT LED chip 523 including the conformal coating layer may be molded by a transparent resin. Furthermore, the molding resin may be molded into a shape of an optical member and thus can act as a primary optical member.

The wavelength conversion layer 525 realizes a color mixture, for example, white light by converting wavelengths of light emitted from the MJT LED chip 523.

The wavelength conversion layer 525 may contain KSF and/or UCD-based phosphors. Accordingly, light emitted from the MJT LED chip 523 and having passed through the wavelength conversion layer 525 may have an NTSC color reproduction of 70% or more.

The MJT LED 500 is designed to have a light beam distribution of a mirror symmetry structure, particularly, a light beam distribution of a rotational symmetry structure. Here, an axis of the MJT LED directed towards the center of the light beam distribution is defined as an optical axis L. That is, the MJT LED 500 is designed to have a light beam distribution bisymmetrical with respect to the optical axis L. Generally, the cavity 512a of the housing 521 can be designed to have a mirror symmetry structure and the optical axis L may be defined as a linear line passing through the center of the cavity 512a.

The optical member 530 includes a light incidence plane receiving light from the MJT LED 500 and a light exit plane through which light is emitted at a greater beam angle than the light emitted from the MJT LED 500, thereby promoting uniform distribution of the light emitted from the MJT LED 500.

Figure 11:
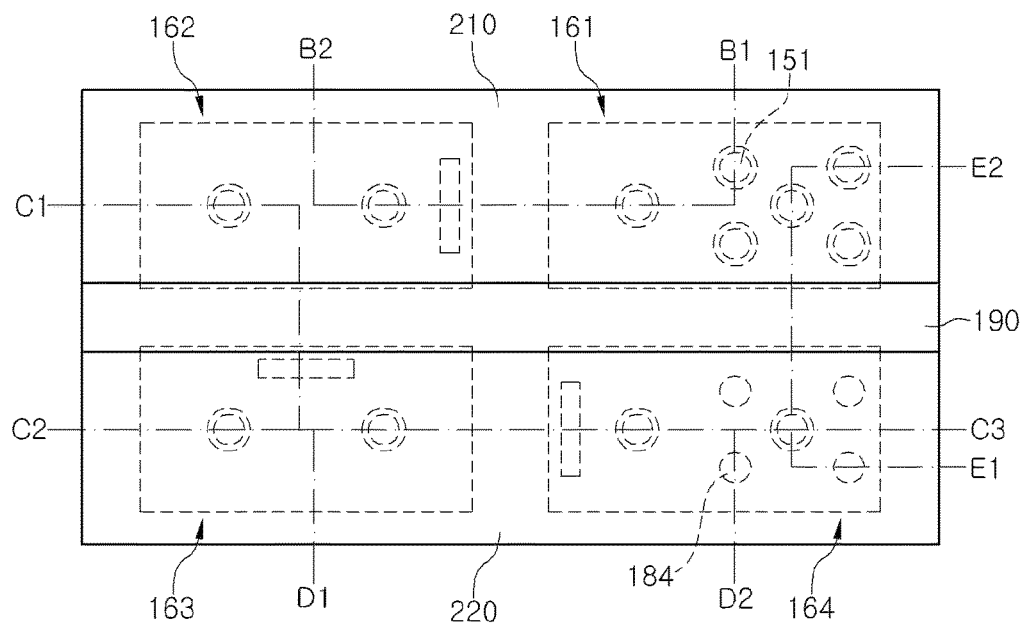
FIG. 11 is a plan view of a light emitting diode of the backlight unit according to the third exemplary embodiment of the disclosure.
Figure 12:
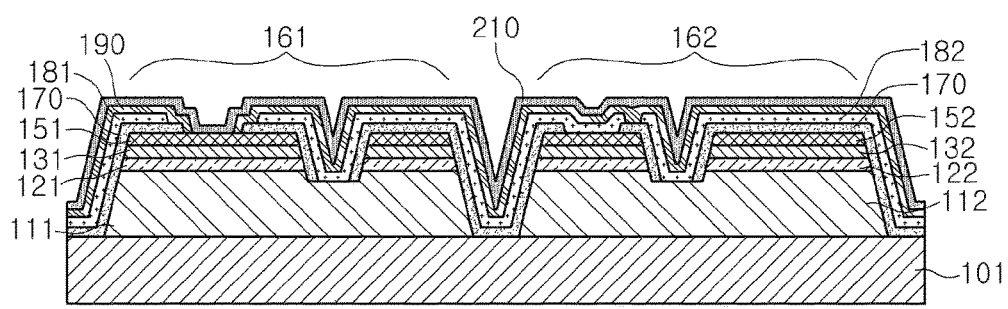
FIG. 12 is a side cross-sectional view taken along line B1-B2 in FIG. 11.
Figure 13:
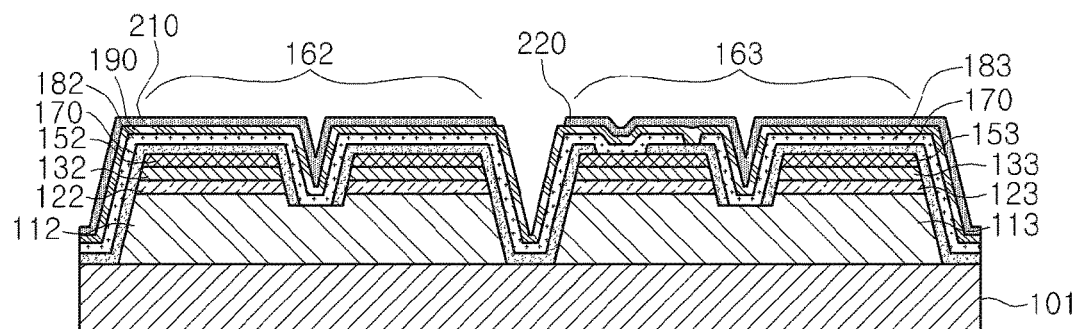
FIG. 13 is a side cross-sectional view taken along line C1-C2 in FIG. 11.
Figure 14:
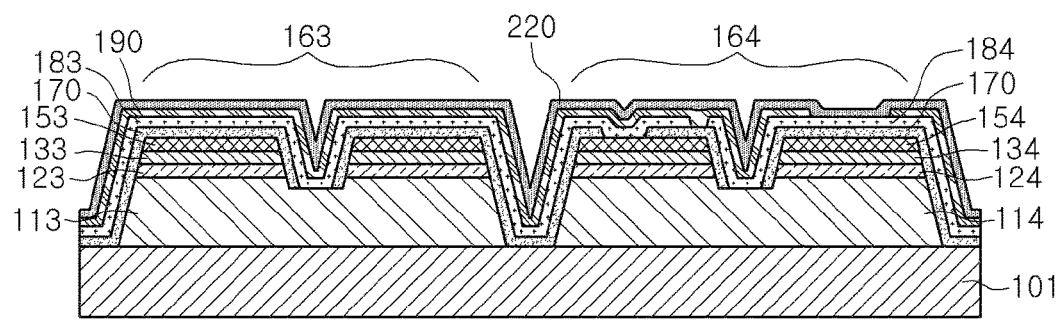
FIG. 14 is a side cross-sectional view taken along line D1-D2 in FIG. 11.
Figure 15:
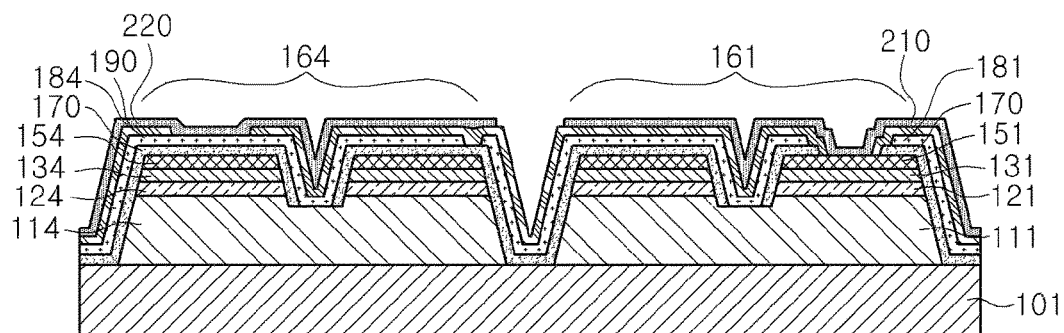
FIG. 15 is a cross-sectional view taken along line E1-E2 of FIG. 11.
Figure 16:
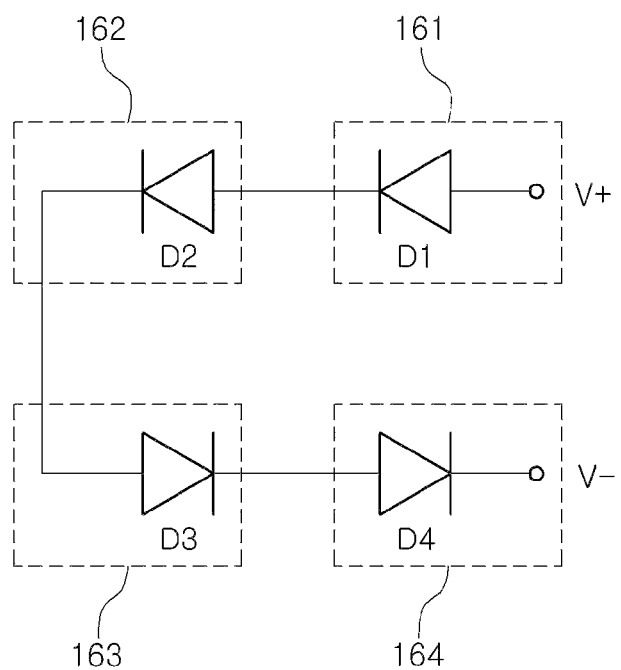
FIG. 16 is an equivalent circuit diagram of light emitting cells according to the third exemplary embodiment of the disclosure.

FIG. 11 is a plan view of the light emitting diode of the backlight unit according to the third exemplary embodiment of the disclosure. FIG. 12 is a cross-sectional view taken along line B1-B2 of FIG. 11, FIG. 13 is a cross-sectional view taken along line C1-C2 of FIG. 11, FIG. 14 is a cross-sectional view taken along line D1-D2 of FIG. 11, and FIG. 15 is a cross-sectional view taken along line E1-E2 of FIG. 11. FIG. 16 is an equivalent circuit diagram of light emitting cells according to the third exemplary embodiment of the disclosure.

Referring to FIG. 11 to FIG. 16, the light emitting diode according to this exemplary embodiment includes a substrate, a first semiconductor layer, an active layer, a second semiconductor layer, a lower electrode, a cell region, a first interlayer insulation layer, an upper electrode, a second interlayer insulation layer, a first pad, and a second pad.

A substrate 101 may be a sapphire substrate, a silicon carbide substrate, or a GaN-based substrate, and may be selected from any substrate so long as the substrate can induce growth of a thin film thereon. A first semiconductor layer 111, 112, 113, 114 may have n-type conductivity. An active layer 121, 122, 123, 124 may have a multi-quantum well structure and a second semiconductor layer 131, 132, 133, 134 may be formed on the active layer 121, 122, 123, 124. When the first semiconductor layer 111 exhibits n-type conductivity, the second semiconductor layer 130 exhibits p-type conductivity. Further, a buffer layer (not shown) may be further formed between the substrate 101 and the first semiconductor layer 111 to facilitate growth of a single crystal of the first semiconductor layer 111.

Lower electrodes 151, 152, 153, 154 are disposed on the second semiconductor layer 131, 132, 133, 134. A plurality of cell regions 161, 162, 163, 164 can be defined through formation of the lower electrodes 151, 152, 153, 154. The lower electrodes 151, 152, 153, 154 may be formed of any metal capable of forming ohmic contact with the second semiconductor layer 130. The lower electrodes 151, 152, 153, 154 may include Ni, Cr or Ti, or may be composed of a composite metal layer of Ti/Al/Ni/Au.

The lower electrodes 151, 152, 153, 154 may have a thickness of 2,000 Å to 10,000 Å. If the lower electrodes 151, 152, 153, 154 have a thickness of less than 2,000 Å, light reflection from the lower electrodes 151, 152, 153, 154 towards the substrate 101 can become inefficient and light leakage occurs through the lower electrodes 151, 152, 153, 154. If the lower electrodes 151, 152, 153, 154 have a thickness of greater than 10,000 Å, there is a problem of excessive time consumption in formation of the lower electrodes through thermal deposition.

Furthermore, each of the lower electrodes 151, 152, 153, 154 may have an inclination b of 10° to 45° with respect to a surface of the second semiconductor layer 130. If the inclination b of each of the lower electrodes 151, 152, 153, 154 is less than 10°, efficiency in reflection of light can be reduced due to a very gentle inclination of the lower electrodes. Moreover, it is difficult to secure a uniform thickness on the surfaces of the lower electrodes due to the low inclination. If the inclination b of each of the lower electrodes 151, 152, 153, 154 exceeds 45°, cracks can be generated on layers formed after the lower electrodes due to the high inclination.

In FIG. 12 to FIG. 15, regions in which the lower electrodes 151, 152, 153, 154 are formed define four cell regions 161, 162, 163, 164. The second semiconductor layer 131, 132, 133, 134 is exposed through separation spaces between the cell regions 161, 162, 163, 164. The number of cell regions 161, 162, 163, 164 may be determined corresponding to the number of light emitting cells included in an MJT LED, which will be formed. Thus, the number of cell regions may be changed in various ways.

Here, four cell regions 161, 162, 163, 164 are completely electrically isolated from one another. Accordingly, first semiconductor layers 111, 112, 113, 114, active layers 121, 122, 123, 124, second semiconductor layers 131, 132, 133, 134, and the lower electrodes 151, 152, 153, 154 are independently formed in the cell regions 161, 162, 163, 164. Thus, in the first cell region 161, the first lower electrode 151 is exposed and the first semiconductor layer 111 is exposed through via-holes 140. Further, in the second cell region 162, the second lower electrode 152 is exposed and the first semiconductor layer 112 is exposed through the via-holes 140. Likewise, in the third cell region 163, the third lower electrode 153 and the first semiconductor layer 113 are exposed, and in the fourth cell region 164, the fourth lower electrode 154 and the first semiconductor layer 114 are exposed.

In this exemplary embodiment, a light emitting cell refers to a structure wherein the first semiconductor layer 111, 112, 113 or 114, the active layer 121, 122, 123 or 124, and the second semiconductor layer 131, 132, 133 or 134 are stacked one above another. Thus, one light emitting cell is formed in one cell region. Further, in the structure wherein the first semiconductor layers 111, 112, 113, 114 exhibit n-type conductivity and the second semiconductor layers 131, 132, 133, 134 exhibit p-type conductivity, the lower electrode 151, 152, 153 or 154 formed on the second semiconductor layer 131, 132, 133 or 134 may be referred to as an anode of a light emitting cell.

A first interlayer insulation layer 170 is disposed to cover upper surfaces of the lower electrodes 151, 152, 153, 154, and side surfaces of the first semiconductor layers 111, 112, 113, 114, the active layers 121, 122, 123, 124 and second semiconductor layers 131, 132, 133, 134. The first semiconductor layers 111, 112, 113, 114 and the lower electrodes 151, 152, 153, 154 are partially exposed through the first interlayer insulation layer 170.

For example, in the first cell region 161, two via-holes are open to expose the first semiconductor layer 111 and a portion of the first lower electrode 151 formed on the second semiconductor layer 131. In addition, in the second cell region 162, the first semiconductor layer 112 is exposed through via-holes and a portion of the second lower electrode 152 is exposed by partially etching the first interlayer insulation layer 170. Further, in the third cell region 163, the first semiconductor layer 113 is exposed through via-holes and a portion of the third lower electrode 153 is exposed by partially etching the first interlayer insulation layer 170. In the fourth cell region 164, the first semiconductor layer 114 is exposed through via-holes and a portion of the fourth lower electrode 154 is exposed by partially etching the first interlayer insulation layer 170.

That is, the first interlayer insulation layer 170 is formed on the entire upper surface of the substrate 101, and in each of the cell regions 161, 162, 163, 164, the first semiconductor layers 111, 112, 113, 114 are exposed through the via-holes and the lower electrodes 151, 152, 153, 154 on the second semiconductor layers 131, 132, 133, 134 are partially exposed through selective etching. The remaining regions are shielded by the first interlayer insulation layer 170.

The first interlayer insulation layer 170 may be formed of an insulation material having a certain light transmittance. For example, the first interlayer insulation layer 170 may include $SiO_2$.

In addition, the first interlayer insulation layer 170 may have a thickness of 2,000 Å to 20,000 Å.

If the thickness of the first interlayer insulation layer 170 is less than 2,000 Å, it is difficult to secure insulation properties due to excessively low thickness thereof. Particularly, in the structure wherein the first interlayer insulation layer 170 is formed on sidewall of the via-holes 140 or the mesa region, the first interlayer insulation layer 170 has a certain inclination, thereby causing insulation failure of the first interlayer insulation layer 170 having a low thickness.

If the thickness of the first interlayer insulation layer 170 exceeds 20,000 Å, a photoresist pattern acting as an etching mask in the process of selectively etching the first interlayer insulation layer 170 can be removed. As a result, a process error can occur, causing etching to be performed at an undesired portion.

Further, the first interlayer insulation layer 170 may have an inclination of 10° to 60° with respect to an exposed surface of the lower electrode.

If the inclination of the first interlayer insulation layer 170 is less than 10°, the surface area of the exposed surface of the lower electrode can be reduced or the substantial thickness of the first interlayer insulation layer 170 can be reduced, thereby making it difficult to secure insulation properties. That is, the first interlayer insulation layer 170 has a function of electrically insulating the lower electrode from other conducive layers formed thereon. Thus, the first interlayer insulation layer 170 is required to have a sufficient thickness and the lower electrode is required to be exposed while having a certain area for electrical connection with other layers. If the first interlayer insulation layer 170 has a very low inclination, the area of the exposed surface of the lower electrode is reduced in order to realize a predetermined thickness of the first interlayer insulation layer 170. Moreover, in the case where the exposed surface of the lower electrode has a predetermined area or more, insulation failure can occur due to the first interlayer insulation layer 170 having a low thickness due to a low inclination.

If the inclination of the first interlayer insulation layer 170 exceeds 60°, a layer formed on the first interlayer insulation layer 170 can suffer from deterioration in film quality due to a steep inclination of the first interlayer insulation layer 170.

Upper electrodes 181, 182, 183, 184 are divided into four regions. For example, a first upper electrode 181 is formed from part in the first cell region 161 to part in the second cell region 162. In addition, a second upper electrode 182 is formed from a portion of the second cell region 162 to a portion of the third cell region 163. A third upper electrode 183 is formed from a portion of the third cell region 163 to a portion of the fourth cell region 164 and a fourth upper electrode 184 is formed on a portion of the fourth cell region 164. Thus, each of the upper electrodes 181, 182, 183, 184 is formed while blocking a separation space between adjacent cell regions. Each of the upper electrodes 181, 182, 183, 184 can cover 30% or more, specifically 50% or more or 90% or more, of the separation space between adjacent cell regions. Here, since the upper electrodes 181, 182, 183, 184 are separated from each other, the upper electrodes 181, 182, 183, 184 cover less than 100% of a region between light emitting diodes.

The entirety of the upper electrodes 181, 182, 183, 184 may occupy 30% or more, specifically 50% or more or 90% or more, of the entire area of the MJT LEDs. Since the upper electrodes 181, 182, 183, 184 are separated from each other, the upper electrodes 181, 182, 183, 184 occupy less than 100% of the entire area of the MJT LEDs. Further, the upper electrodes 181, 182, 183, 184 have a plate or sheet shape, which has a ratio of length to width in the range of 1:3 to 3:1. Furthermore, at least one of the upper electrodes 181, 182, 183, 184 has a greater length or width than the corresponding light emitting cell (cell region).

The first upper electrode 181 is formed on the first interlayer insulation layer 170 in the first cell region 161 and on the first semiconductor layer 111 exposed through the via-holes. In addition, the first upper electrode 181 exposes a portion of the first lower electrode 151 in the first cell region 161 and is formed on the exposed second lower electrode 152 in the second cell region 162.

In addition, the second upper electrode 182 is physically separated from the first upper electrode 181 and some of the second upper electrode 182 is formed on the first semiconductor layer 112 exposed through the via-holes in the second cell region 162. The remaining portion of the second upper electrode 182 is formed on the first interlayer insulation layer 170.

The first upper electrode 181 electrically connects the first semiconductor layer 111 in the first cell region 161 to the second semiconductor layer 132 in the second cell region 162. The second lower electrode 152 in the second cell region 162 is electrically short-circuited in one cell region despite the presence of the via-hole. Thus, the first semiconductor layer 111 in the first cell region 161 is electrically connected to the second semiconductor layer 132 in the second cell region 162 through the second lower electrode 152.

The second upper electrode 182 is formed on the first semiconductor layer 112 exposed through the via-holes in the second cell region 162 and extends to the third lower electrode 153 in the third cell region 163.

Further, the third upper electrode 183 physically separated from the second upper electrode 182 is formed on the first semiconductor layer 113 exposed through the via-holes in the third cell region 163.

The second upper electrode 182 is electrically connected to the first semiconductor layer 112 exposed through the via-holes in the second cell region 162 and is also electrically connected to the third lower electrode 153 in the third cell region 163. Thus, the first semiconductor layer 112 in the second cell region 162 can be maintained in an equipotential state with the second semiconductor layer 133 in the third cell region 163.

The third upper electrode 183 is formed on the first semiconductor layer 113 exposed through the via-holes in the third cell region 163 and extends to the fourth lower electrode 154 in the fourth cell region 164. Thus, the first semiconductor layer 113 in the third cell region 163 is electrically connected to the second semiconductor layer 134 in the fourth cell region 164.

Further, the fourth upper electrode 184 physically separated from the third upper electrode 183 is electrically connected to the first semiconductor layer 114 exposed through the via-holes in the fourth cell region 164.

The fourth upper electrode 184 is formed on the first semiconductor layer 114 exposed through the via-holes in the fourth cell region 164. In addition, the first upper electrode 181 physically separated from the fourth upper electrode 184 is formed on the first semiconductor layer 111 exposed through the via-holes in the first cell region 161, and exposes a portion of the first lower electrode 151 in the first cell region 161.

In summary, the first semiconductor layer 111 in the first cell region 161 and the second semiconductor layer 132 in the second cell region 162 form an equipotential state through the first upper electrode 181. Further, the first semiconductor layer 112 in the second cell region 162 and the second semiconductor layer 133 in the third cell region 163 form an equipotential state through the second upper electrode 182. The first semiconductor layer 113 in the third cell region 163 and the second semiconductor layer 134 in the fourth cell region 164 form an equipotential state through the third upper electrode 183. In the first cell region 161, the first lower electrode 151 electrically connected to the second semiconductor layer 131 is exposed. It should be understood that formation of the equipotential state is based on ideal electrical connection by ignoring resistance of the upper electrodes 181, 182, 183, 184 and contact resistance between the upper electrodes 181, 182, 183, 184 and the lower electrodes 151, 152, 153, 154. Thus, in actual device operation, voltage drop can often occur due to a resistance component of the upper electrodes 181, 182, 183, 184 and the lower electrodes 151, 152, 153, 154, which pertain to a kind of metal interconnection line.

Further, the upper electrodes 181, 182, 183, 184 may be formed of any material capable of forming ohmic contact with the first semiconductor layers 111, 112, 113, 114. Alternatively, the upper electrodes 181, 182, 183, 184 may be formed of any material capable of forming ohmic contact with the lower electrodes 151, 152, 153, 154, which are a metallic material. Thus, the upper electrodes 181, 182, 183, 184 may include a metal layer including Ni, Cr, Ti, Rh or Al, or a conductive oxide layer such as ITO as an ohmic contact layer.

Further, each of the upper electrodes 181, 182, 183, 184 may include a reflective layer such as Al, Ag, Rh or Pt in order to reflect light, which is generated from each of the active layers 121, 122, 123, 124 in the cell regions 161, 162, 163, 164, towards the substrate 101. Particularly, light generated from the active layers 121, 122, 123, 124 is reflected towards the substrate 101 by the lower electrodes 151, 152, 153, 154, respectively. In addition, light transferred through separation spaces between the cell regions 161, 162, 163, 164 is reflected by the upper electrodes 181, 182, 183, 184, which shield the separation spaces between the cell regions 161, 162, 163, 164, respectively.

Each of the upper electrodes 181, 182, 183, 184 may have a thickness of 2,000 Å to 10,000 Å. If the thickness of each of the upper electrodes 181, 182, 183, 184 is less than 2,000 Å, reflection of light from the upper electrodes 181, 182, 183, 184 towards the substrate 101 becomes inefficient and light can leak through the upper electrodes 181, 182, 183, 184. If the thickness of each of the upper electrodes 181, 182, 183, 184 exceeds 10,000 Å, there is a problem of excessive time consumption in the process of forming the upper electrodes, such as thermal deposition.

Each of the upper electrodes 181, 182, 183, 184 may have an inclination of 10° to 45° with respect to a surface of the first interlayer insulation layer 170. If the inclination of each of the upper electrodes 181, 182, 183, 184 is less than 10°, efficiency in reflection of light can be reduced due to a very gentle inclination of the upper electrodes. Moreover, it is difficult to secure a uniform thickness on the surfaces of the upper electrodes due to the low inclination. If the inclination of each of the upper electrodes 181, 182, 183, 184 exceeds 45°, cracks can be generated on layers formed after the upper electrodes due to the high inclination.

Adjustment in inclination of each of the upper electrodes 181, 182, 183, 184 with respect to the surface of the first interlayer insulation layer 170 can be achieved through placement of the substrate and variation in angle of the substrate with respect to a traveling direction of metal atoms in thermal deposition.

Further, in the structure wherein the first semiconductor layers 111, 112, 113, 114 exhibit n-type conductivity and the second semiconductor layers 131, 132, 133, 134 exhibit p-type conductivity, each of the upper electrodes 181, 182, 183, 184 can act as a cathode of the corresponding light emitting cell while acting as an interconnection line connected to an anode, that is, a lower electrode of a light emitting cell formed in another cell region adjacent thereto. That is, the upper electrode of a light emitting cell in a certain cell region can act as a cathode while acting as an interconnection line electrically connected to the anode of the light emitting cell in the other cell region adjacent to the cell region.

The first to third upper electrodes 181 to 183 are formed in at least two cell regions. Thus, a separation space between adjacent cell regions is shielded. The upper electrode reflects light, which can be leaked between adjacent cell regions, through the substrate and is electrically connected to the first semiconductor layer in each of the cell regions. Further, the upper electrode in a certain cell region is electrically connected to the second semiconductor layer in another cell region adjacent thereto.

Referring to FIG. 16, four light emitting cells D1, D2, D3, D4 and interconnection lines therebetween will be described.

A first light emitting cell D1 is formed in the first cell region 161, a second light emitting cell D2 is formed in the second cell region 162, a third light emitting cell D3 is formed in the third cell region 163, and a fourth light emitting cell D4 is formed in the fourth cell region 164. Here, in the cell regions 161, 162, 163, 164, each of the first semiconductor layers 111, 112, 113, 114 may be an n-type semiconductor layer and each of the second semiconductor layers 131, 132, 133, 134 may be a p-type semiconductor layer.

The first upper electrode 181 is electrically connected to the first semiconductor layer 111 in the first cell region 161 and extends to the second cell region 162 to be electrically connected to the second semiconductor layer 132 in the second cell region 162. Thus, the first upper electrode 181 acts as an interconnection line that connects a cathode of the first light emitting cell D1 to an anode of the second light emitting cell D2.

Further, the second upper electrode 182 acts as an interconnection line that connects a cathode of the second light emitting cell D2 to an anode of the third light emitting cell D3, and the third upper electrode 183 acts as an interconnection line that connects a cathode of the third light emitting cell D3 to an anode of the fourth light emitting cell D4. Furthermore, the fourth upper electrode 184 acts as an interconnection line that forms a cathode of the fourth light emitting cell D4.

Thus, the anode of the first light emitting cell D1 and the cathode of the fourth light emitting cell D4 are electrically open with respect to an external power source, and the remaining light emitting cells D2, D3 are connected to each other in series. In order to perform light emitting operation, the anode of the first light emitting cell D1 is connected to a positive voltage source V+ and the cathode of the fourth light emitting cell D4 is connected to a negative voltage source V−. Thus, the light emitting cell connected to the positive voltage source V+ is referred to as an input light emitting cell and the light emitting cell connected to the negative voltage source V− is referred to as an output light emitting cell.

In the cell region in which the cathode connected to the negative voltage source V− is formed, the upper electrode is formed to shield only a portion of the corresponding cell region. In other cell regions, the upper electrodes are formed to shield the separation spaces between the cell regions electrically connected to each other.

Referring to FIG. 12 to FIG. 15 again, the upper electrodes are shielded through the second interlayer insulation layer 190, and the first lower electrode 151 and the fourth upper electrode 184 are partially exposed therethrough. This structure means that only the anode of first light emitting cell D1 and the cathode of the fourth light emitting cell are exposed.

In the first cell region 161, the first lower electrode 151 electrically connected to the second semiconductor layer 131 is opened. The other cell regions including the second cell region 162 are covered by the second interlayer insulation layer 190.

The second cell region 162 and the third cell region 163 are completely covered by the second interlayer insulation layer 190.

The fourth upper electrode 184 in the fourth cell region 164 is exposed and the first lower electrode 151 in the first cell region 161 is exposed.

Exposure of the fourth upper electrode 184 and the first lower electrode 151 is performed through selective etching of the second interlayer insulation layer 190.

The second interlayer insulation layer 190 is formed of an insulation material capable of protecting layers under the second interlayer insulation layer from external environments. Particularly, the second interlayer insulation layer 190 may be formed of SiN, which exhibits insulation characteristics and can block change in temperature or humidity.

The second interlayer insulation layer 190 may have a predetermined range of thickness. For example, when the second interlayer insulation layer 190 includes SiN, the second interlayer insulation layer 190 may have a thickness of 2,000 Å to 20,000 Å.

If the thickness of the second interlayer insulation layer 190 is less than 2,000 Å, it is difficult to secure insulation properties due to a low thickness thereof. In addition, there is a problem in protection of the layers under the second interlayer insulation layer 190 from external moisture or chemical compounds due to a low thickness thereof.

If the thickness of the second interlayer insulation layer 190 exceeds 20,000 Å, it is difficult to perform selective etching of the second interlayer insulation layer 190 through formation of a photoresist pattern.

Further, the second interlayer insulation layer 190 may have an inclination of 10° to 60° with respect to the surface of the fourth upper electrode 184 or the first lower electrode 151 exposed to the outside.

If the inclination of the second interlayer insulation layer 190 is less than 10°, a substantial area of the fourth upper electrode 184 or the first lower electrode 151 exposed to the outside is decreased. In addition, if the area of the exposed portion is increased in order to secure a substantial area, there is a problem in that insulation properties cannot be secured due to the low inclination.

If the inclination of the second interlayer insulation layer 190 exceeds 60°, other layers formed on the second interlayer insulation layer 190 can suffer from deterioration in quality or cracking due to a sharp inclination. Moreover, deterioration in characteristics occurs upon light emitting operation through continuous power supply.

Referring to FIG. 11 again, a first pad 210 may be formed over the first cell region 161 and the second cell region 162. With this structure, the first pad 210 forms electrical connection with the first lower electrode 151 of the first cell region 161.

In addition, a second pad 220 is separated from the first pad 210 by a predetermined distance and may be formed over the third cell region 163 and the fourth cell region 164. The second pad 220 is electrically connected to the fourth upper electrode 184 of the fourth cell region 164.

Referring to FIG. 12, the first pad 210 is formed over the first cell region 161 and the second cell region 162. The first pad 210 is formed on the exposed first lower electrode 151 in the first cell region 161. In other regions, the first pad 210 is formed on the second interlayer insulation layer 190. Accordingly, the first pad 210 is electrically connected to the second semiconductor layer 131 of the first cell region 161 through the first lower electrode 151.

Referring to FIG. 13, the first pad 210 is formed on the second cell region 162 and the second pad 220 is formed on the third cell region 163 so as to be separated from the first pad 210. In the second cell region 162 and the third cell region 163, the first pad 210 or the second pad 220 is prevented from making electrical contact with the lower electrode or the upper electrode.

Referring to FIG. 14, the second pad 220 is formed over the third cell region 163 and the fourth cell region 164. Particularly, the fourth upper electrode 184 open in the fourth cell region 164 is electrically connected to the second pad 220. Thus, the second pad 220 is electrically connected to the first semiconductor layer 114 in the fourth cell region 164.

Referring to FIG. 15, the second pad 220 is formed on the fourth cell region 164 and the first pad 210 is formed on the first cell region 161 so as to be separated from the second pad 220. The first pad 210 is formed on first lower electrode 151 in the first cell region 161 to be electrically connected to the second semiconductor layer 131.

Figure 17:
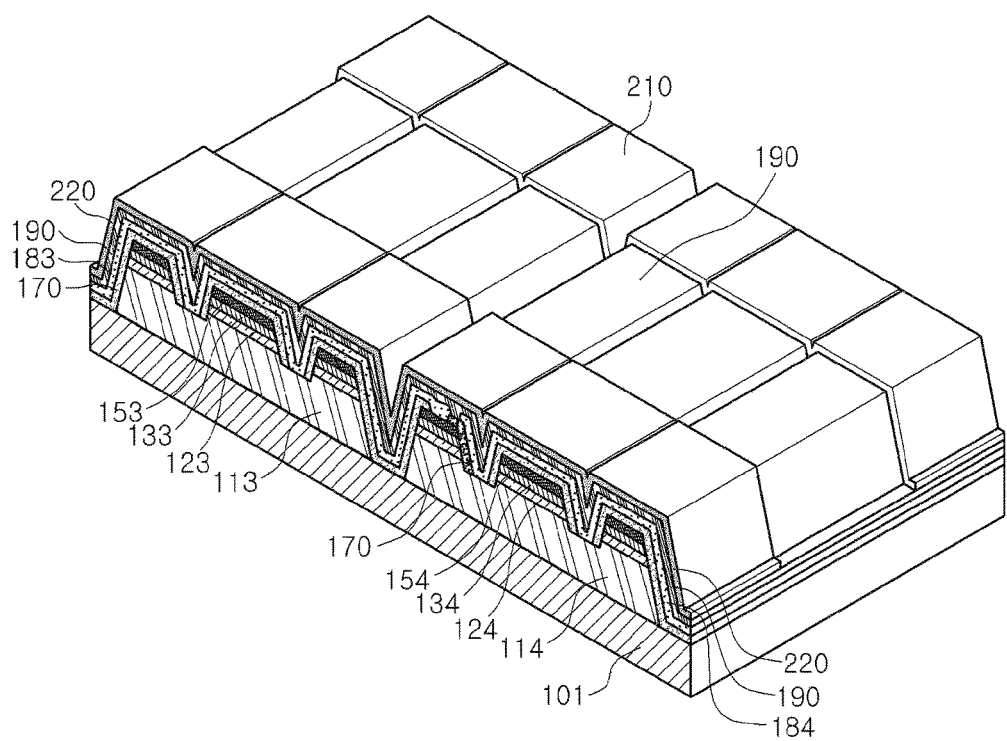
FIG. 17 is a perspective view of a section taken along line C2-C3 of FIG. 11.

FIG. 17 is a perspective view taken along line C2-C3 of the plan view of FIG. 11.

Referring to FIG. 11 to FIG. 17, the first semiconductor layer 113 of the third cell region 163 is electrically connected to the third upper electrode 183. The third upper electrode 183 shields a separation space between the third cell region 163 and the fourth cell region 164, and is electrically connected to the fourth lower electrode 154 in the fourth cell region 164. Further, the first and second pads 210, 220 are separated from each other and are formed on the second interlayer insulation layer 190. Of course, as described above, the first pad 210 is electrically connected to the second semiconductor layer 131 in the first cell region 161 and the second pad 220 is electrically connected to the first semiconductor layer 111 in the fourth cell region 164.

Each of the first and second pads 210, 220 may include a first layer including Ti, Cr or Ni and a second layer formed on the first layer and including Al, Cu, Ag or Au. Further, the first pad 210 and the second pad 220 may be formed by a lift-off process. Alternatively, each of the first and second pads 210, 220 may be formed by forming a single or double-metal layer, forming a pattern through a typical photolithography process, and dry etching or wet etching using the pattern as an etching mask. Here, etchants for dry etching or wet etching may be determined depending upon a material of the metal layer to be etched.

In this way, the first pad 210 and the second pad 220 may be formed at the same time through a single process.

Further, a pad barrier layer (not shown) formed of a conductive material may be formed on the first pad 210 or the second pad 220. The pad barrier layer prevents diffusion of metal, which can occur upon bonding or soldering with respect to the pads 210, 220. For example, upon bonding or soldering, the pad barrier layer prevents bonding metals or tin atoms included in the solders from diffusing into the pads 210, 220, thereby preventing increase in resistance of the pads. To this end, the pad barrier layer may be formed of Cr, Ni, Ti W, TiW, Mo, Pt or combinations thereof.

Referring to a model shown in FIG. 16, in each of the cell regions, the first semiconductor layer 111, 112, 113 or 114 is an n-type semiconductor layer and the second semiconductor layer 131, 132, 133 or 134 is a p-type semiconductor layer. In the first cell region 161, the first lower electrode 151 formed on the second semiconductor layer 131 is an anode of first light emitting cell D1. Thus, the first pad 210 can be modeled as an interconnection line connected to an anode of the first light emitting cell D1. Further, the fourth upper electrode 184 electrically connected to the first semiconductor layer 114 of the fourth cell region 164 is a cathode of the fourth light emitting cell D4. Thus, the second pad 220 can be modeled as an interconnection line connected to the cathode of the fourth light emitting cell D4.

As a result, four light emitting cells D1 to D4 are connected to each other in series and electrical connection to an external power source is achieved through two pads 210, 220 formed on one substrate 101.

Particularly, referring to FIG. 16, the first lower electrode 152 of the first light emitting cell D1 connected to a positive voltage source V+ is electrically connected to the first pad 210 and the fourth upper electrode 184 of the fourth light emitting cell D4 connected to a negative voltage source V− is electrically connected to the second pad 220.

In this exemplary embodiment, four light emitting cells are formed to be separated from each other such that an anode of one light emitting cell is electrically connected to a cathode of another light emitting cell through a lower electrode and an upper electrode. However, it should be understood that other implementations are also possible and various numbers of light emitting cells can be formed according to exemplary embodiments.

Figure 18:
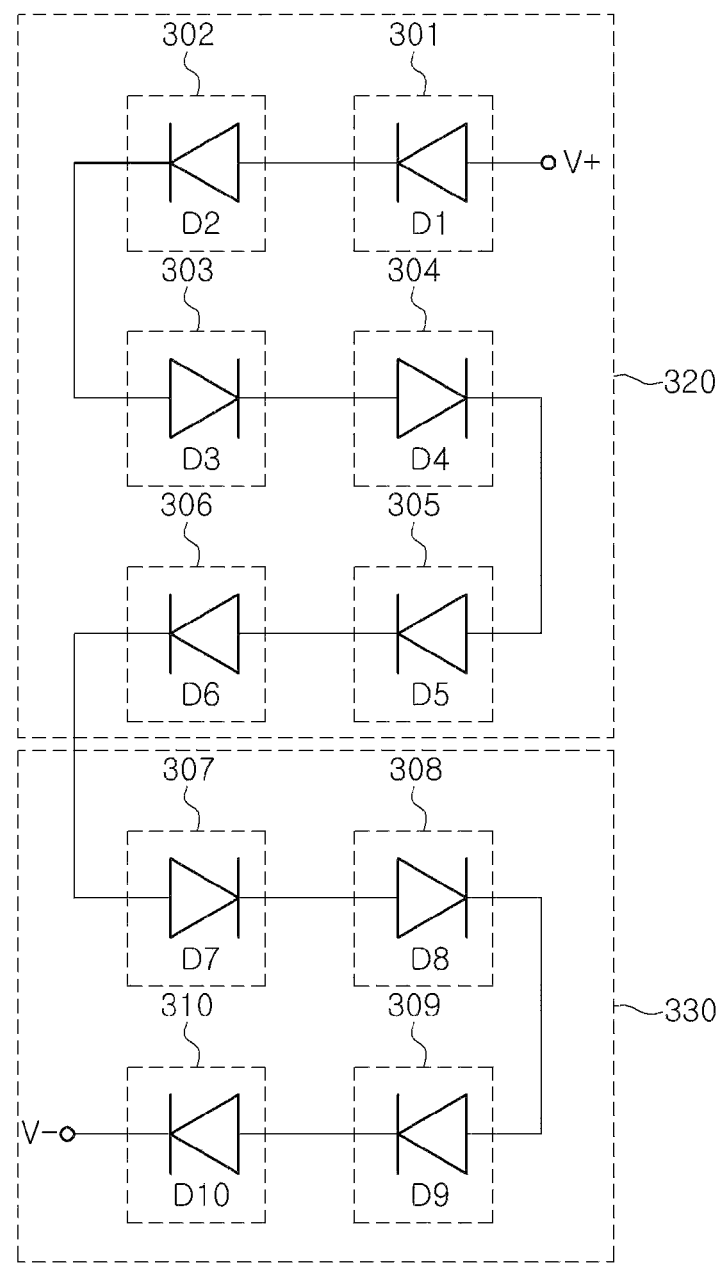
FIG. 18 is a circuit diagram of ten light emitting cells connected to each other in series according to the third exemplary embodiment of the disclosure.

FIG. 18 is a circuit diagram of 10 light emitting cells connected to each other in series according to the third exemplary embodiment of the disclosure.

Referring to FIG. 18, 10 cell regions 301 to 310 are defined. In each of the cell regions 301 to 310, a first semiconductor layer, an active layer, a second semiconductor layer and a lower electrode are separated from those of other cell regions. Each of lower electrodes is formed on the second semiconductor layer to form an anode of each of light emitting cells D1 to D10.

A first interlayer insulation layer and upper electrodes are disposed on the lower electrodes. Here, each of the upper electrodes shields a separation space between adjacent cell regions and acts as an interconnection line which achieves electrical connection between anodes of adjacent light emitting cells.

Further, the second interlayer insulation layer is formed on the upper electrodes, the lower electrode of the first light emitting cell D1 corresponding to an input light emitting cell connected to a positive voltage source V+ in a current path is exposed, and the upper electrode of the tenth light emitting cell D10 corresponding to an output light emitting cell connected to a negative voltage source V− is opened. Then, a first pad 320 is formed and connected to an anode of the first light emitting cell D1. In addition, a second pad 330 is formed and connected to a cathode of the tenth light emitting cell D10.

Other light emitting cells may be connected to each other in series/parallel.

Figure 19:
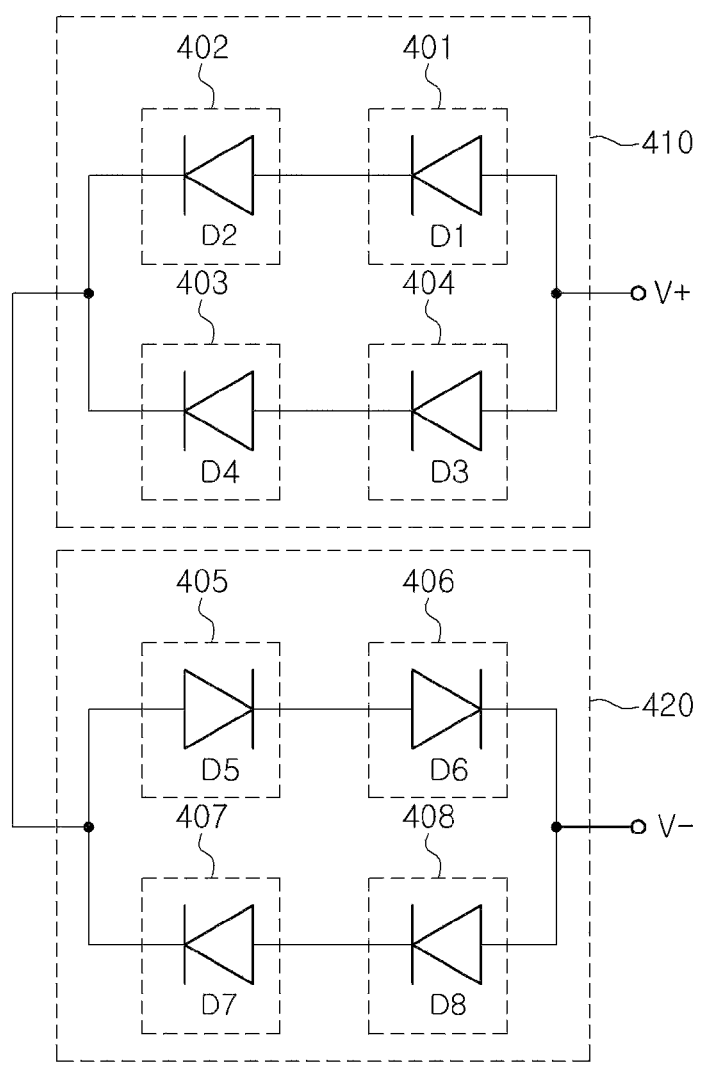
FIG. 19 is a circuit diagram of light emitting cells connected to each other in series/parallel according to the third exemplary embodiment of the disclosure.

FIG. 19 is a circuit diagram of light emitting cells connected to each other in series/parallel according to the third exemplary embodiment of the disclosure.

Referring to FIG. 19, some light emitting cells D1 to D8 are connected to each other in series while adjacent light emitting cells are connected to each other in parallel. Each of the light emitting cells D1 to D8 is independently formed by defining the cell regions 401 to 408. As described above, anodes of the light emitting cells D1 to D8 are formed through the lower electrodes. Further, cathodes of the light emitting cells D1 to D8 and an interconnection line to the anodes of adjacent light emitting cells are formed through the upper electrodes and suitable interconnection lines. Here, the lower electrodes are formed on the second semiconductor layer and each of the upper electrodes is formed to shield a separation space between adjacent cell regions.

The first pad 410 to which a positive voltage V+ is finally supplied is electrically connected to a lower electrode formed on the second semiconductor layer formed on the first light emitting cell D1 or the third light emitting cell D3, and the second pad 420 to which a negative voltage V− is finally supplied is electrically connected to an upper electrode corresponding to a cathode of the sixth light emitting cell D6 or the eighth light emitting cell D8.

Accordingly, in FIG. 19, the input light emitting cell corresponds to the first light emitting cell D1 and the third light emitting cell D3, and the output light emitting cell corresponds to the sixth light emitting cell D6 and the eighth light emitting cell D8.

According to the exemplary embodiment described above, light generated from the active layer of each of the light emitting cells is reflected towards the substrate by the lower electrode and the upper electrode, and flip-chip type light emitting cells are electrically connected to each other through the interconnection lines of the upper electrodes on one substrate. The upper electrodes are shielded by the second interlayer insulation layer. The first pad to which a positive voltage is supplied is electrically connected to a lower electrode of a light emitting cell connected to a positive voltage source placed nearest the light emitting cell. Further, the second pad to which a negative voltage is supplied is electrically connected to an upper electrode of a light emitting cell connected to a negative voltage source placed nearest the light emitting cell.

Thus, it is possible to resolve process inconvenience of realizing a two-terminal network to an external power source through interconnection lines arranged on a sub-mount substrate after mounting a plurality of flip-chip type chips on the sub-mount substrate. In addition, the separation space between the cell regions is shielded by the upper electrodes, thereby maximizing reflection of light towards the substrate.

Further, the second interlayer insulation layer protects a plurality of stack structures disposed between the substrate and the second interlayer insulation layer from external temperature and moisture. Accordingly, it is possible to realize a structure in which light emitting diode chips are directly mounted on the substrate without separate packaging means.

Particularly, since it is possible to realize a plurality of flip-chip type light emitting cells on one substrate, there is an advantage in that a commercial power source can be directly used without voltage drop, level change or wavelength change of the commercial power source.

Figure 20:
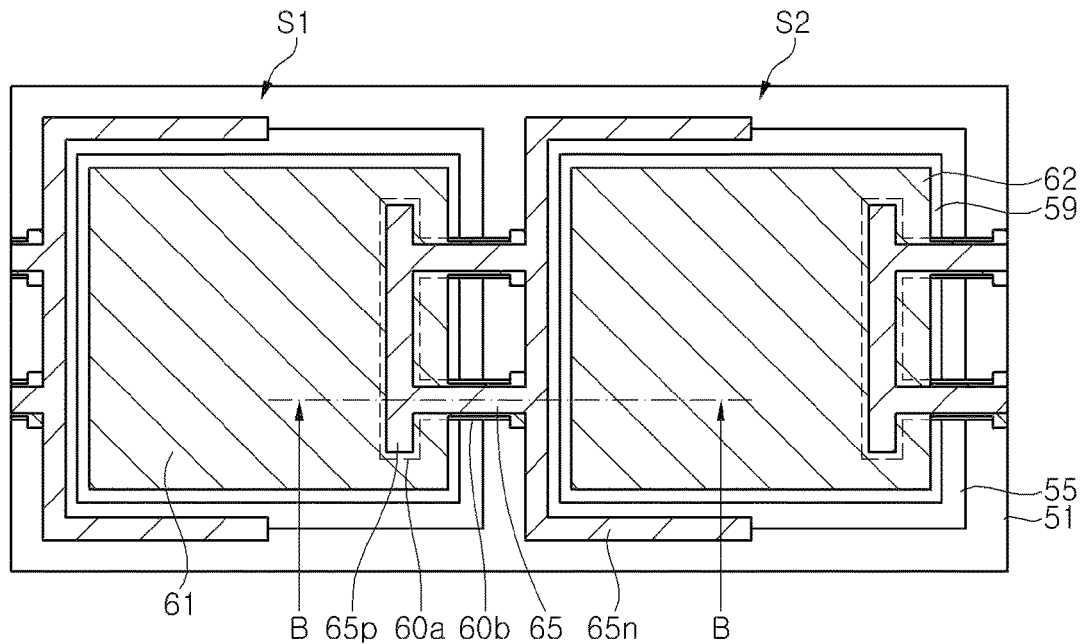
FIG. 20 is a plan view of an MJT LED chip according to a fourth exemplary embodiment of the disclosure.
Figure 21:
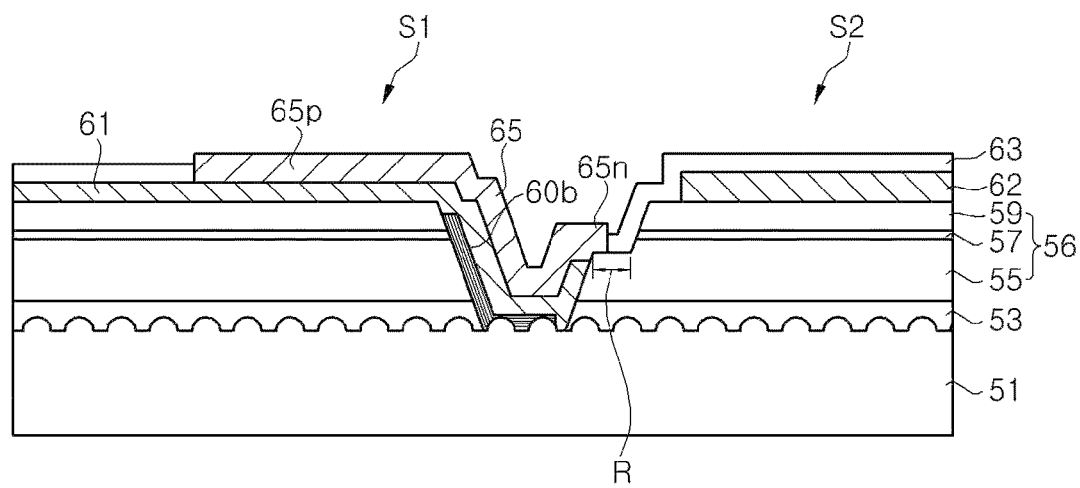
FIG. 21 is a cross-sectional view taken along line B-B of FIG. 20.

FIG. 20 is a schematic plan view of an MJT LED chip according to a fourth exemplary embodiment of the disclosure and FIG. 21 is a cross-sectional view taken along line B-B of the plan view shown in FIG. 20, illustrating the MJT LED chip according to the fourth exemplary embodiment of the disclosure.

Referring to FIG. 20 and FIG. 21, an MJT LED chip 523 according to the fourth exemplary embodiment includes a growth substrate 51, light emitting cells S1, S2, transparent electrode layers 61, 62, an insulation layer 60b, an insulation protection layer 63, and an interconnection line 65. The MJT LED chip 123 may further include a buffer layer 53. The MJT LED chip 523 may further include a current blocking layer 60a.

The growth substrate 51 may be an insulation or conductive substrate, and may include, for example, a sapphire substrate, a GaN substrate, a silicon carbide SiC substrate, or a silicon substrate. The growth substrate 51 may be a growth substrate having a convex-concave pattern formed on an upper surface thereof, like a patterned sapphire substrate. The convex-concave pattern can improve light extraction efficiency by effectively reflecting light emitted from light emitting cells and directed towards the growth substrate.

A first light emitting cell S1 and a second light emitting cell S2 are disposed on a single growth substrate 51 to be separated from each other. Each of the first and second light emitting cells S1, S2 has a stack structure 56, which includes a lower semiconductor layer 55, an upper semiconductor layer 59 disposed in one region of the lower semiconductor layer, and an active layer 57 interposed between the lower semiconductor layer and the upper semiconductor layer. Here, the lower and upper semiconductor layers are n-type and p-type semiconductor layers, respectively, or vice versa.

Each of the lower semiconductor layer 55, the active layer 57 and the upper semiconductor layer 59 may be formed of GaN-based semiconductor material, for example, (Al, In, Ga)N. Composition elements and ratios of the active layer 57 are determined to emit light having a desired wavelength, for example, UV light or blue light, and the lower semiconductor layer 55 and the upper semiconductor layer 59 are formed of a material having a greater energy band-gap than the active layer 57.

As shown in the drawings, the lower semiconductor layer 55 and/or the upper semiconductor layer 59 may have a single layer structure, or a multilayer structure. The active layer 57 may have a single quantum well or multi-quantum well structure.

Each of the first and second light emitting cells S1, S2 may have an inclined side surface, which may have an inclination in the range of, for example, 15° to 80° with respect to an upper surface of the growth substrate 51.

The active layer 57 and the upper semiconductor layer 59 are disposed on the lower semiconductor layer 55. At least part of an upper surface of the lower semiconductor layer 55 may be covered by the active layer 57 and the remaining part thereof may be exposed instead of being covered by the active layer 57. For example, as shown in FIG. 21, the upper surface of the lower semiconductor layer 55 may include an exposed region R. The exposed region R is an exposed portion of the lower semiconductor layer 55 not covered by the active layer 57 and the upper semiconductor layer 59, specifically, an exposed portion of the upper surface of the lower semiconductor layer 55. The exposed region R may be placed parallel to a side surface of the lower semiconductor layer 55 facing an adjacent light emitting cell, but is not limited thereto. Alternatively, the exposed region R may be placed so as to surround at least part of the active layer 57 and the upper semiconductor layer 59.

Although FIG. 21 shows part of the first light emitting cell S1 and the second light emitting cell S2, the first light emitting cell S1 and the second light emitting cell S2 may have a similar or the same structure, as shown in FIG. 20. That is, the first light emitting cell S1 and the second light emitting cell S2 may have the same GaN-based semiconductor stack structure and may have an inclined side surface of the same structure.

In some exemplary embodiments, the buffer layer 53 may be interposed between the light emitting cells S1, S2 and the growth substrate 51. The buffer layer 53 serves to relieve lattice mismatch between the growth substrate 51 and the lower semiconductor layer 55 formed on the growth substrate 51.

The transparent electrode layers 61, 62 are disposed on the light emitting cells S1, S2, respectively. That is, a first transparent electrode layer 61 is disposed on the first light emitting cell S1 and a second transparent electrode layer 62 is disposed on the second light emitting cell S2. The transparent electrode layers 61, 62 may be disposed on an upper surface of the upper semiconductor layer 59 to contact the upper semiconductor layer 59 and may have a narrower area than the upper semiconductor layer 59. That is, the transparent electrode layers 61, 62 may be recessed from an edge of the upper semiconductor layer 59. Thus, it is possible to prevent current crowding at edges of the transparent electrode layers 61, 62 through sidewalls of the light emitting cells S1, S2.

A portion of the first transparent electrode layer 61 may be connected to the second light emitting cell S2. Specifically, a portion of the first transparent electrode layer 61 may extend from an upper surface of the first light emitting cell S1 to a side surface of the lower semiconductor layer 55 of the second light emitting cell S2 through a space between the first light emitting cell S1 and the second light emitting cell S2. Thus, even in the case where an interconnection line 65 is disconnected, electric current can flow through the first transparent electrode layer 61, thereby improving electric stability of the MJT LED chip. Furthermore, the first transparent electrode layer 61 may further extend to be disposed on the exposed region R of the upper surface of the lower semiconductor layer 55. The first transparent electrode layer 61 may be separated from the active layer 57 and the upper semiconductor layer 59 of the second light emitting cell S2.

Meanwhile, the insulation layer 60b covers a portion of the side surface of the first light emitting cell S1. As shown in FIG. 20 and FIG. 21, the insulation layer 60b may extend to a region between the first light emitting cell S1 and the second light emitting cell S2 and may cover a portion of the side surface of the lower semiconductor layer 55 of the second light emitting cell S2. The insulation layer 60b is formed of an insulation material, and particularly may include a distributed Bragg reflector in which layers having different indices of refraction are alternately stacked one above another, without being limited thereto. In the exemplary embodiment wherein the insulation layer 60b includes the distributed Bragg reflector having a multilayer structure, the insulation layer 60b can effectively suppress generation of defects such as pinholes therein.

The interconnection line 65 electrically connects the first light emitting cell S1 and the second light emitting cell S2 to each other. The interconnection line 65 includes a first connection portion 65p and a second connection portion 65n. The first connection portion 65p is electrically connected to the first transparent electrode layer 61 on the first light emitting cell S1 and the second connection portion 65n is electrically connected to the lower semiconductor layer 55 on the second light emitting cell S2. The first connection portion 65p may be placed near an edge of the first light emitting cell S1, but is not limited thereto. Alternatively, the first connection portion 65p may be placed at a central region of the first light emitting cell S1.

The second connection portion 65n may be electrically connected to the lower semiconductor layer 55 of the second light emitting cell S2. Specifically, the second connection portion 65n may be electrically connected to the upper surface of the lower semiconductor layer 55 of the second light emitting cell S2 through the exposed region R. Further, the first transparent electrode layer 61 may be disposed between the second connection portion 65n and the lower semiconductor layer 55 of the second light emitting cell S2. In this structure, the first transparent electrode layer 61 may be disposed on the side surface of the lower semiconductor layer 55 of the second light emitting cell S2 and on the exposed region R of the lower semiconductor layer 55.

The second connection portion 65n may contact the inclined side surface of the second light emitting cell S2, particularly, the inclined side surface of the lower semiconductor layer 55 of the second light emitting cell S2. In addition, as shown in FIG. 5, the second connection portion 65n may electrically contact the inclined side surface of the lower semiconductor layer 55 while extending to both sides of the second light emitting cell S2 along the periphery of the second light emitting cell S2. The first light emitting cell S1 and the second light emitting cell S2 are connected to each other in series by the first and second connection portions 65p, 65n of the interconnection line 65.

The interconnection line 65 may contact the transparent electrode layers 61, 62 throughout an overall region overlapping the transparent electrode layers 61, 62. Although a portion of an insulation layer is interposed between a transparent electrode layer and an interconnection line in the related art, this exemplary embodiment allows the interconnection line 65 and the transparent electrode layers 61, 62 to directly contact each other without any insulation material being interposed therebetween.

A portion of the first transparent electrode layer 61 disposed on the side surface of the lower semiconductor layer 55 of the second light emitting cell S2 may have a greater width than a portion of the interconnection line 65 disposed on the side surface of the lower semiconductor layer 55 of the second light emitting cell S2. Accordingly, electric current can be easily spread in a region in which the side surface of the second light emitting cell S2 adjoins the interconnection line 65, thereby improving luminous uniformity of the MJT LED chip.

In addition, a portion of the first transparent electrode layer 61 disposed between the first light emitting cell S1 and the second light emitting cell S2 may have a greater width than a portion of the interconnection line 65 disposed between the first light emitting cell S1 and the second light emitting cell S2. Generally, when the insulation protection layer 63 is etched using an etching solution such as hydrofluoric acid, the insulation layer 60b including an oxide layer can be damaged due to the etching solution. In this case, the insulation layer 60b fails to insulate the interconnection line 65 from the first light emitting cell S1, thereby causing short circuit. On the contrary, according to this exemplary embodiment, since the first transparent electrode layer 61 is disposed on the insulation layer 60b and a portion of the first transparent electrode layer 61 disposed between the first light emitting cell S1 and the second light emitting cell S2 has a greater width than a portion of the interconnection line 65 disposed between the first light emitting cell S1 and the second light emitting cell S2, the insulation layer 60b under the transparent electrode layer 62 can be protected from etching damage. Thus, it is possible to prevent short circuit caused by the interconnection line 65.

Although the first connection portion 65p and the second connection portion 65n of the interconnection line 65 are illustrated as being connected to each other through two paths in FIG. 20, the first connection portion 65p and the second connection portion 65n may be connected to each other through one path.

Meanwhile, when the insulation layer 60b exhibits reflection characteristics similar to a distributed Bragg reflector, it is desirable that the insulation layer 60b be restrictively placed substantially in the same region as the interconnection line 65 in a region that is two or less times the area of the interconnection line 65. The insulation layer 60b prevents light emitted from the active layer 57 from being absorbed into the interconnection line 65. However, since the insulation layer having an excessively wide area can block light from being emitted to the outside, there is a need for restriction on the area of the insulation layer.

The insulation protection layer 63 may be placed outside the region of the interconnection line 65. The insulation protection layer 63 covers the first and second light emitting cells S1, S2 outside the region of the interconnection line 65. The insulation protection layer 63 may be formed of a silicon oxide layer (SiO$_2$) or a silicon nitride layer. The insulation protection layer 63 has an opening which exposes the first transparent electrode layer 61 on the first light emitting cell S1 and the lower semiconductor layer on the second light emitting cell S2, and the interconnection line 65 may be disposed inside the opening of the insulation protection layer 63.

A side surface of the insulation protection layer 63 may face or contact a side surface of the interconnection line 65. One side surface of the insulation protection layer 63 may be disposed on the exposed region R and may contact the side surface of the interconnection line 65. Alternatively, the side surface of the insulation protection layer 63 may be separated from the side surface of the interconnection line 65 so as to face each other.

According to this exemplary embodiment, since the second connection portion 65n electrically contacts the upper surface of the lower semiconductor layer 55, that is, a non-inclined surface thereof, the second connection portion 65n disposed on the upper surface of the lower semiconductor layer 55 has a constant thickness. As a result, the interconnection line can have improved reliability. Furthermore, since the insulation protection layer 63 contacts the interconnection line 65 on the side surface and the non-inclined upper surface of the lower semiconductor layer 55 in the second light emitting cell S2, an interface between the insulation protection layer 63 and the interconnection line 65 can have a generally constant area. Accordingly, a defect rate of the MJT LED can be reduced.

Furthermore, the current blocking layer 60a and the insulation layer 60b may include the same material and the same structure, and may be simultaneously formed by the same process. Furthermore, since the interconnection line 65 is disposed in the opening of the insulation protection layer 63, the insulation protection layer 63 and the interconnection line 65 may be formed using the same mask pattern.

In this exemplary embodiment, two light emitting cells, that is, the first light emitting cell S1 and the second light emitting cell S2 are illustrated. However, it should be understood that the disclosure is not limited to two light emitting cells and more light emitting cells can be electrically connected to each other through interconnection lines 65. For example, the interconnection lines 65 electrically connect the lower semiconductor layers 55 and the transparent electrode layers 61 of adjacent light emitting cells, thereby forming a series array of light emitting cells. Such arrays may be formed in plural and may be connected to each other in reverse parallel to be driven by an AC power source. Furthermore, a bridge rectifier (not shown) connected to the series array of light emitting cells may be formed such that the light emitting cells can be driven by the bridge rectifier under AC power. The bridge rectifier may be formed by connecting light emitting cells having the same structure as the light emitting cells S1, S2 to each other through the interconnection lines 65.

A larger number of light emitting cells in each of the MJT LEDs can provide a smaller area of each of the blocks of the printed circuit board. Accordingly, it is possible to provide a backlight unit which can reduce the droop phenomenon by the larger number of light emitting cells while realizing various luminous arrangements by a large number of MJT LEDs.

Figure 22:
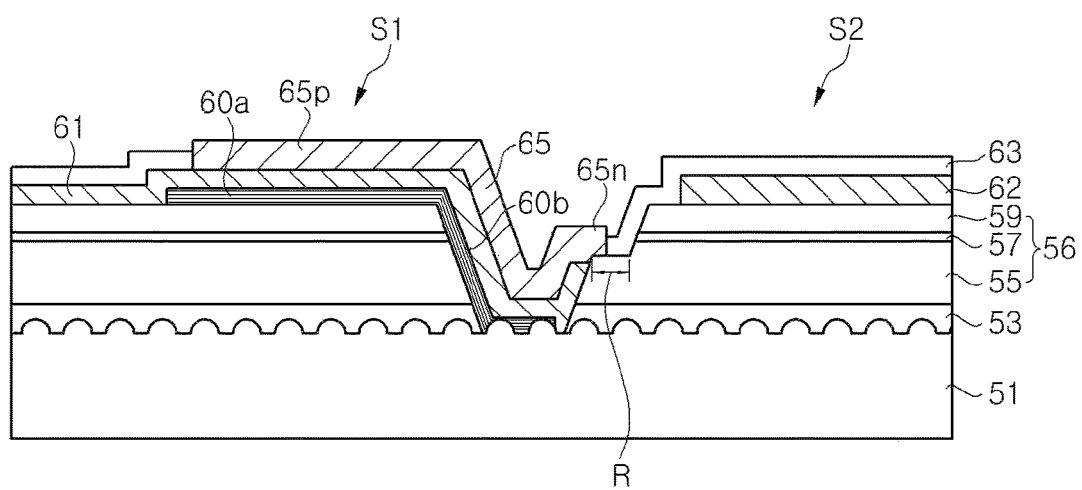
FIG. 22 is a cross-sectional view of an MJT LED chip according to a fifth exemplary embodiment of the disclosure.

FIG. 22 is a schematic cross-sectional view of an MJT LED chip according to a fifth exemplary embodiment of the disclosure.

The MJT LED chip shown in FIG. 22 is similar to the MJT LED chip shown in FIG. 20 except that the MJT LED chip according to this exemplary embodiment further includes a current blocking layer 60a.

The current blocking layer 60a may be disposed on each of light emitting cells S1, S2 and interposed between transparent electrode layers 61, 62 and the light emitting cells S1, S2. Specifically, the current blocking layer 60a is interposed between the first light emitting cell S1 and the first transparent electrode layer 61 so as to separate a portion of the first transparent electrode layer 61 from the first light emitting cell S1. Thus, a portion of the transparent electrode layers 61, 62 is disposed on the current blocking layer 60a. The current blocking layer 60a may be placed near an edge of each of the light emitting cells S1, S2, but is not limited thereto. Alternatively, the current blocking layer 60a may be placed at a central region of each of the light emitting cells S1, S2.

The current blocking layer 60a can suppress current crowding around the interconnection lines 65, thereby improving current spreading efficiency of the MJT LED chip.

The current blocking layer 60a is formed of an insulation material and, in particular, may include a distributed Bragg reflector in which layers having different indices of refraction are alternately stacked one above another. The insulation layer 60b may be formed of the same material and have the same structure as the current blocking layer 60a, but is not limited thereto. The insulation layer 60b may be formed of a different material by a different process than the current blocking layer 60a.

The insulation layer 60b may be connected to the current blocking layer 60a to be adjacent thereto, but is not limited thereto. Alternatively, the insulation layer 60b may be separated from the current blocking layer 60a.

The current blocking layer 60a may be formed by depositing an insulation material, followed by patterning through photolithography and etching. Alternatively, the current blocking layer 60a may be may be formed using an insulation material through lift-off. Particularly, the current blocking layer 60a may be formed as a distributed Bragg reflector in which layers having different indices of refraction, for example, $SiO_2$ and $TiO_2$ layers are alternately stacked one above another. As shown in FIG. 22, the current blocking layer 60a and the insulation layer 60b may be connected to each other, but are not limited thereto.

The current blocking layer 60a may be disposed over an overall overlapping region between the interconnection line 65 and the transparent electrode layers 61, 62. Furthermore, the current blocking layer 60a and the insulation layer 60b may be disposed over the overall overlapping region between the interconnection line 65 and the first light emitting cell S1.

When the current blocking layer 60a exhibits reflection characteristics similar to a distributed Bragg reflector, it is desirable that the current blocking layer 60a be restrictively placed substantially in the same region as the interconnection line 65 in a region that is two or less times the area of the interconnection line 65. The current blocking layer 60a prevents light emitted from the active layer 57 from being absorbed into the interconnection line 65. However, since the current blocking layer having an excessively wide area can block light from being emitted to the outside, there is a need for restriction on the area of the current blocking layer.

Referring to FIG. 22, the transparent electrode layers 61, 62 are connected to the upper semiconductor layer 59 and some portions of the transparent electrode layers 61, 62 are placed on the current blocking layer 60a and on the insulation layer 60b. In addition, the first connection portion 65p of the interconnection line 65 may be connected to the first transparent electrode layer 61 in an upper region of the current blocking layer 60a.

Figure 23A:
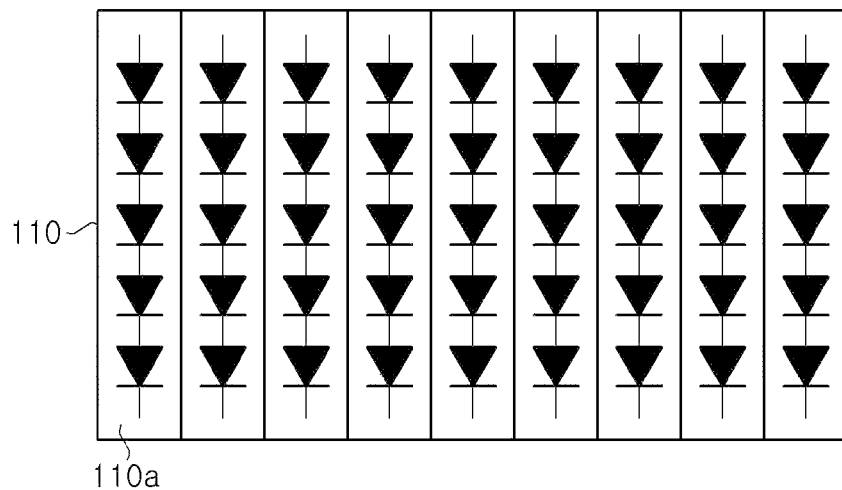
FIG. 23A and FIG. 23B are schematic views comparing a typical backlight unit with a backlight unit according to one exemplary embodiment of the disclosure.
Figure 23B:
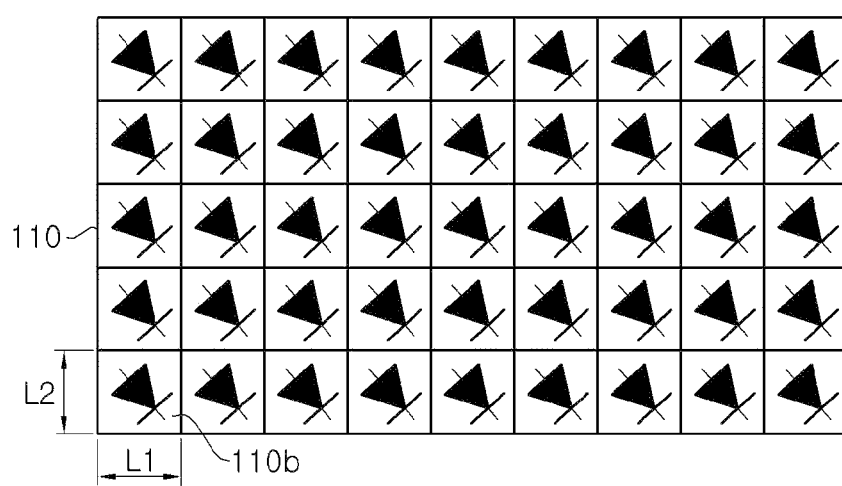

FIG. 23 is schematic views comparing a typical backlight unit (a) with a backlight unit (b) according to one exemplary embodiment of the disclosure.

Referring to FIG. 23, a typical backlight unit (a) includes a plurality of LED chips each including a single light emitting cell, in which the LED chips are connected to each other in series and/or in parallel to form at least one array 110a and can be driven in units of each array 110a. Conversely, in the backlight unit (b) according to the exemplary embodiment, MJT LEDs can be independently driven instead of being connected to each other in series, in parallel, or in series/parallel. Thus, for example, the typical backlight unit (a) includes 9 arrays 110a, whereas the backlight unit (b) according to the exemplary embodiment may include 45 blocks.

Such a structural difference provides the following difference in terms of effect. In FIG. 23, (a) shows the typical backlight unit as a comparative example and (b) shows the backlight unit according to the exemplary embodiment as an example. Both backlight units of the example and the comparative example were driven by a DC converter voltage of 24V and the IC drive voltage was 3V. In the comparative example, a single light emitting cell LED chip had a drive voltage of 3.6V and each array had a voltage loss of 3V. In the example, each MJT LED had a drive voltage of 3.3V and each block 110*b* had a voltage loss of 1.2V.

The backlight unit of the comparative example was driven at 0.4 A and the backlight unit of the example could be drive at 0.075 A. Thus, the backlight unit of the example had an effect of reducing the droop phenomenon at high current. In addition, the backlight unit of the comparative example had a drive power of 75.6 W and a power loss of 10.9 W, and the backlight unit of the example had a drive power of 70.87 W and a power loss of 4.05 W. The backlight units had driving efficiencies of 85.7% (comparative example) and 94.2% (example), respectively. Thus, it could be confirmed that the backlight unit according to the exemplary embodiment had higher driving efficiency.

Figure 24A:
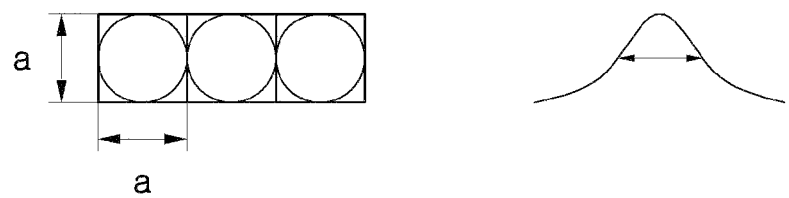
FIGS. 24A, 24B, and 24C are combined plan and graphical views of a backlight module according to the disclosure, including square blocks each including a lens for local dimming applied to an MJT LED.
Figure 24B:
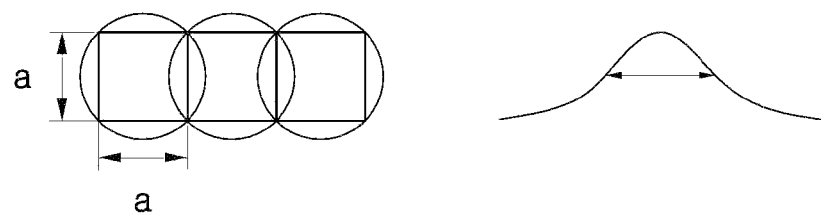
Figure 24C:
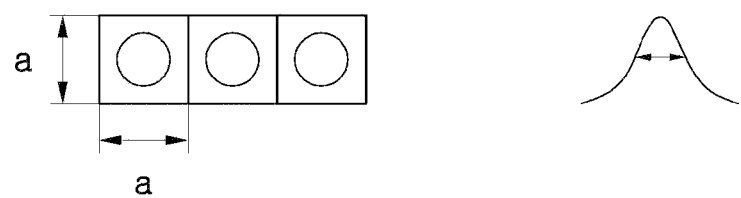

FIG. 24 is a view of a backlight module according to the disclosure, which includes square blocks each including a lens for local dimming applied to an MJT LED. FIG. 24(*a*) shows a backlight module in which the full width at half maximum is the same as the width of each block, and FIG. 24(*b*) shows a backlight module in which the full width at half maximum is greater than the width of each block. In addition, FIG. 24(*c*) shows a backlight module in which the full width at half maximum is less than the width of the block.

Referring to FIG. 24(*a*), one MJT LED is disposed in each block of the display module and a lens for local dimming is applied to each of the MJT LEDs. In this way, the lens is directly applied to the MJT LED and the illumination intensity of light passing through the lens is shown at the right of FIG. 24(*a*). Here, the full width at half maximum of the illumination intensity of light emitted from one block may be the same as the width of the block.

Further, in order to allow the full width at half maximum of light emitted from one block to include the entirety of one block, the full width at half maximum may be the same as a diagonal length of a square block, as shown in FIG. 24(*b*). Further, assuming that the square block has a width $\alpha$, the minimum full width at half maximum of light emitted from one block can be 0.6$\alpha$.

Accordingly, in this exemplary embodiment in which a lens is applied as an optical member, the full width at half maximum of light emitted from the block may be greater than or equal to 0.6$\alpha$ and less than or equal to $\sqrt{2}\alpha$. Here, the range of the full width at half maximum is determined in consideration of uniformity of the entirety of the plural blocks.

In this exemplary embodiment, the lens is directly formed on the wavelength conversion layer 525 of the MJT LED, as shown in FIG. 8, and may be formed separately from the optical member 530 shown in FIG. 7. That is, in this exemplary embodiment, the lens directly formed on the MJT LED is used and may be integrally formed therewith.

Figure 25A:
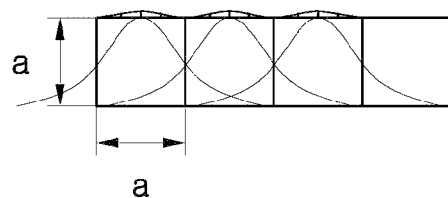
FIGS. 25A, 25B, and 25C are combined schematic and graphical views of overlap in illumination intensities of light emitted from MHT LEDs formed in blocks of a backlight module according to the disclosure, in which a lens for local dimming is formed on each of the blocks.
Figure 25B:
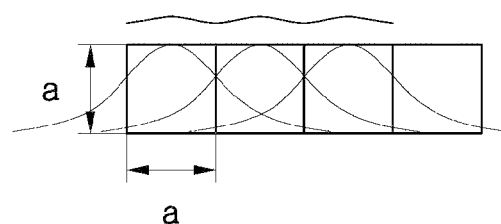
Figure 25C:
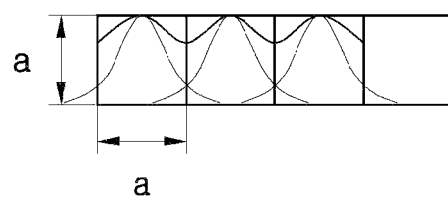

FIG. 25 is a view showing overlap of illumination intensities of light emitted from MHT LEDs formed in blocks of a backlight module according to the disclosure, in which a lens for local dimming is formed on each of the blocks.

As shown in FIG. 25(*a*), when the full width at half maximum is the same as the width of a square block (FWHM=a), the intensity of light emitted through the lens formed on each of the blocks is 100%. As shown in FIG. 25(*b*), when the full width at half maximum is $\sqrt{2}\alpha$, that is, the diagonal length of the square block, the intensity of light emitted through each lens is 100% or more, and when the full width at half maximum is 0.6$\alpha$, the intensity of light may range from 50% to 100%.

Further, uniformity of light from the entirety of the blocks can improve with increasing full width at half maximum, and when the full width at half maximum is 0.6$\alpha$, the uniformity of light may be about 50%. Here, in order to improve uniformity, an optical sheet may be applied to the backlight unit. With the optical sheet, the uniformity of light from the entirety of the blocks can be improved by about 20% to 30%.

Figure 26A:
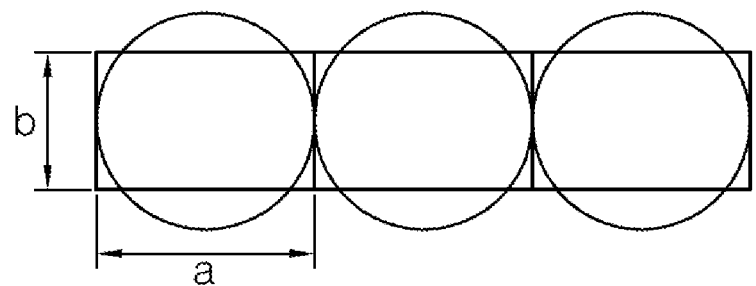
FIGS. 26A, 26B, and 26C are schematic plan views of a backlight module according to the disclosure, including rectangular blocks each including a lens for local dimming.
Figure 26B:
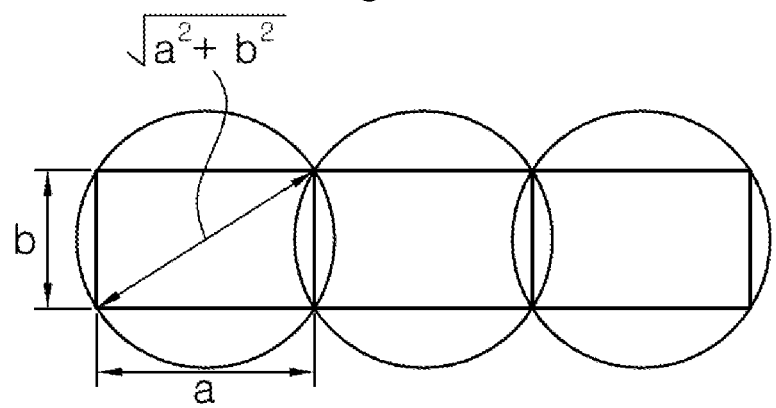
Figure 26C:
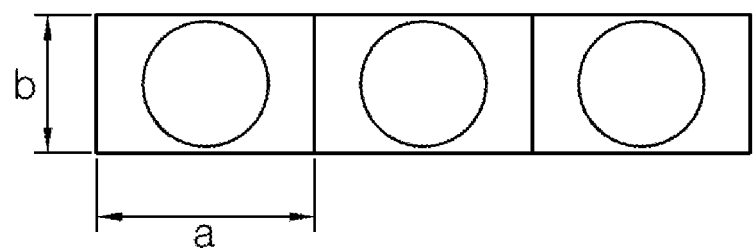

FIG. 26 is a view of a backlight module according to the disclosure, which includes rectangular blocks each including a lens for local dimming.

FIG. 26(*a*) shows that the full width at half maximum of light emitted through each of lenses applied to a backlight module including rectangular-shapes blocks, one side of which has a length a and another side of which has a length b, is $\alpha$. FIG. 26(*b*) shows that the full width at half maximum is the same as the diagonal length of each block, that is, $\sqrt{a^2+b^2}$, in order to occupy the entirety of one block. FIG. 26(*c*) shows that the full width at half maximum has a minimum value in consideration of uniformity of light. That is, the full width at half maximum may be 0.6$\alpha$.

Thus, in consideration of uniformity of the intensity of light in a backlight unit including rectangular blocks (a>b), one side of which has a length $\alpha$ and another side of which has a length b, the full width at half maximum of the illumination intensity may be greater than or equal to 0.6a and less than or equal to $\sqrt{a^2+b^2}$.

Here, although the lengths of the sides of each block, that is, a and b, determine the size of the block, these values may also determine distances between MJT LEDs included in the blocks. That is, the distance between the MJT LEDs in a direction of one side of the block may be a and the distance between the MJT LEDs in a direction of another side of the block may be b.

Figure 27:
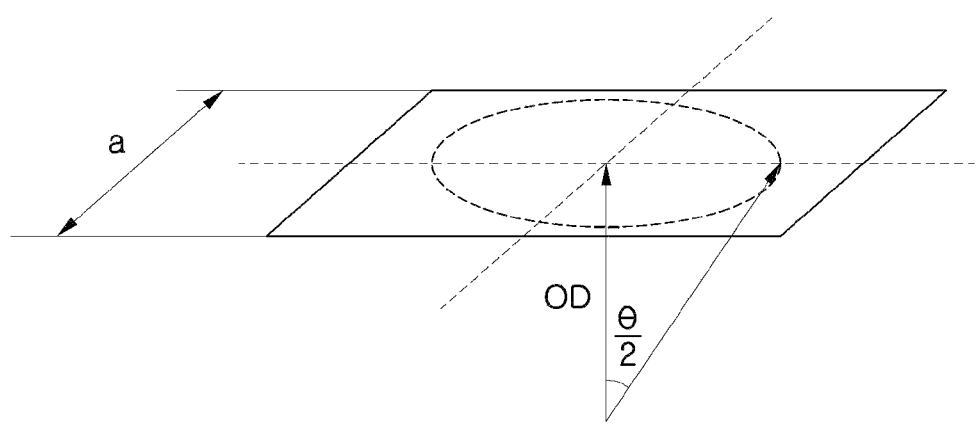
FIG. 27 is a perspective view of calculating a beam angle of light emitted through a lens with respect to full width at half maximum of the light.

FIG. 27 is a view for calculation of a beam angle of light emitted through a lens with respect to full width at half maximum of the light.

Referring to FIG. 27, assuming that the distance from a light source to a diffusive plane is OD and an angle of light emitted from the light source to the lens is $\theta$ in order to obtain a relationship between the full width at half maximum (FWHM) and the beam angle of a lens in one block, the full width at half maximum (FWHM) can be represented by Equation 1.

$$\tan\frac{\theta}{2} = \frac{\frac{1}{2}FWHM}{OD} \quad \text{[Equation 1]}$$

In addition, the beam angle of light upon application of no lens is the full width at half maximum of the MJT LED, and the beam angle of light upon application of a lens is the full width at half maximum in consideration of uniformity of light. Thus, the beam angle of the lens can be represented by Equation 2.

$$\theta_{LED} \to FWHM_{LED} \quad \text{[Equation 2]}$$
$$\theta_{Lens} \to 0.6a \leq FWHM_{Lens} \leq \sqrt{a^2+b^2}$$
$$\theta_{Lens} > 2\tan^{-1}\left(\frac{FWHM_{LED}}{2OD}\right)$$

Figure 28A:
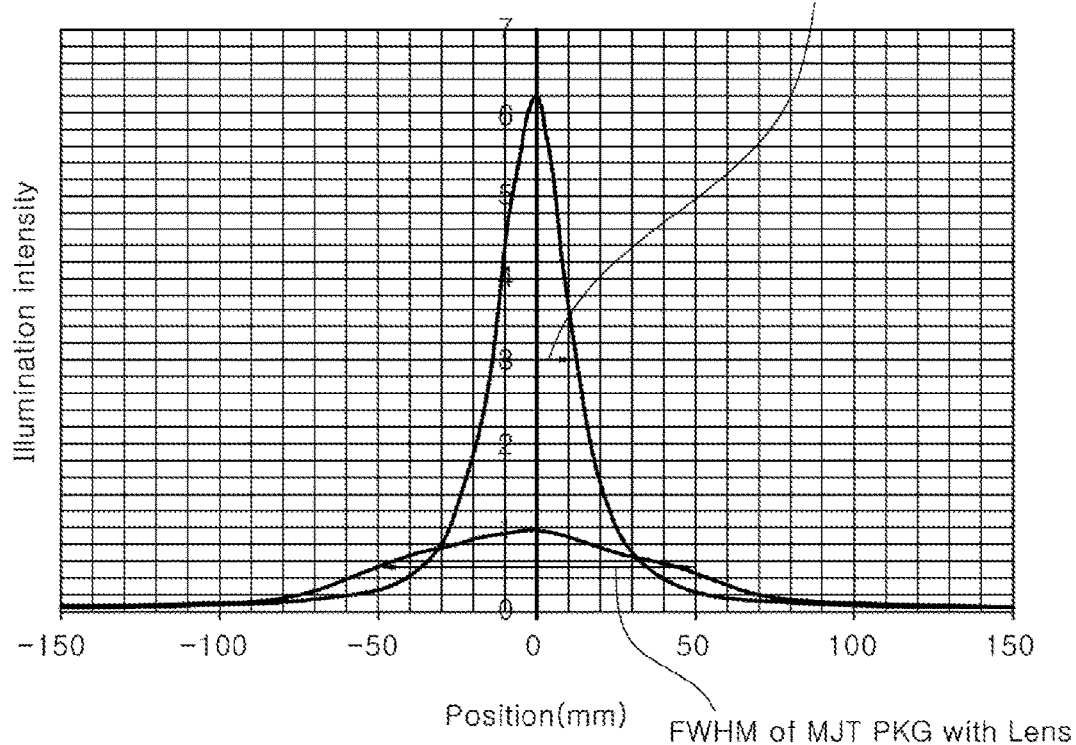
FIG. 28A is a graph depicting a relationship between distance from a light source to a lens and full width at half maximum.
Figure 28B:
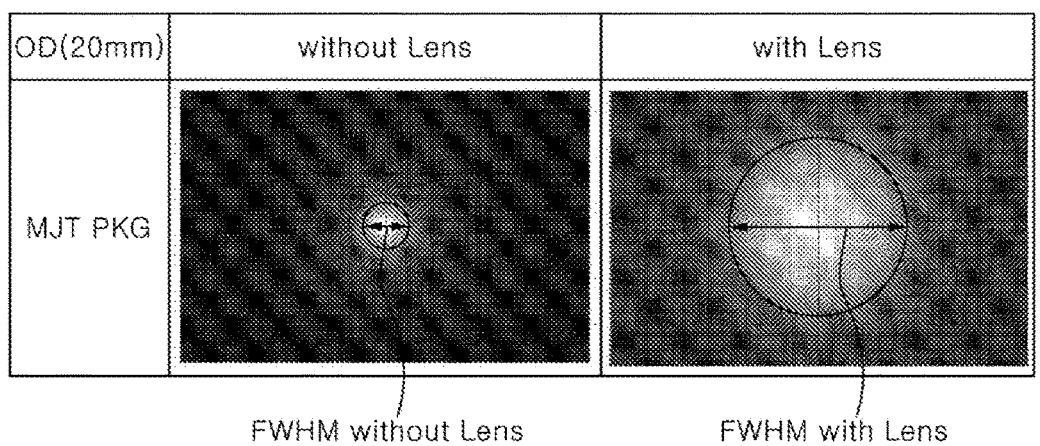
FIG. 28B is a schematic including comparative representations of visible light.

FIG. 28 is a graph depicting a relationship between distance from a light source to a lens and full width at half maximum.

Based on the above relationship, the full width at half maximum depending upon the distance from the light source to the lens is shown in Table 1 and can be depicted by a graph as shown in FIG. 28(a). A difference in illumination intensity of light at an OD of 20 mm between the presence of the lens and the absence of the lens can be as shown in FIG. 33(b).

TABLE 1

| OD | FWHM | |
|---|---|---|
|  | MJT PKG ($\theta_{Lens}$) | MJT PKG + Lens ($\theta_{Lens}$) |
| 10 | 13.1 | 49.25 |
| 15 | 19.65 | 73.875 |
| 20 | 26.2 | 98.5 |
| 25 | 32.75 | 123.125 |
| 30 | 39.3 | 147.75 |

It should be understood that the disclosure is not limited to the above exemplary embodiments and experimental examples, and that that various modifications and changes can be made to the invention without departing from the spirit and scope of the disclosure, as defined by the appended claims and equivalents thereof.

What is claimed is:

1. A backlight unit comprising:
a backlight module comprising:
a printed circuit board including blocks and multi junction technology light emitting diodes (MJT LEDs) disposed on the blocks, respectively; and
a backlight control module generating a signal for drive control of each of the blocks,
wherein:
each block comprises at least one MJT LED,
the backlight control module comprises a drive controller for On/Off control and dimming control of each block, and
each MJT LED comprises:
a plurality of light emitting cells comprising a first light emitting cell and a second light emitting cell, the plurality of light emitting cells being disposed on a single growth substrate separated from each other, each of the light emitting cells comprising: a lower semiconductor layer, an upper semiconductor layer disposed on the lower semiconductor layer, and an active layer disposed between the upper and lower semiconductor layers;
a reflective layer disposed on the first light emitting cell and electrically connected to the first light emitting cell;
an upper electrode electrically connecting the first light emitting cell to the second light emitting cell;
a first insulation layer insulating the upper electrode from a side surface of the first light emitting cell; and
a first pad and a second pad disposed above the upper electrode,
wherein the plurality of light emitting cells are connected in series to each other between an input light emitting cell and an output light emitting cell,
wherein the first pad is electrically connected to the input light emitting cell and the second pad is electrically connected to the output light emitting cell.

2. The backlight unit of claim 1, wherein:
the backlight control module further comprises a drive power generator configured to supply a drive voltage to each block.

3. The backlight unit of claim 2, wherein:
the drive controller is configured to independently detect and control a drive current for each block.

4. The backlight unit of claim 2, wherein:
each block comprises an anode and a cathode; and
the anode and the cathode of each block are directly connected to the drive power generator and the drive controller, respectively.

5. The backlight unit of claim 4, wherein:
the first pad of each MJT LED is connected to the drive power generator and the second pad of each MJT LED is connected to the drive controller.

6. The backlight unit of claim 1, wherein:
the drive controller is configured to perform dimming control with respect to each block through PWM control in response to the signal.

7. The backlight unit of claim 1, wherein:
the number of blocks is M×N and the blocks are arranged in an M×N matrix, where M and N are natural numbers.

8. The backlight unit of claim 1, wherein:
an upper surface of the lower semiconductor layer of the second light emitting cell comprises an exposed region exposed through the upper semiconductor layer and the active layer;
the upper electrode has a first connection portion for electrical connection to the first light emitting cell and a second connection portion for electrical connection to the second light emitting cell;
the first connection portion contacting the reflective layer; and
the second connection portion being electrically connected to the exposed region of the lower semiconductor layer of the second light emitting cell.

9. The backlight unit of claim 1, further comprising:
field effect transistors (FETs); and
an FET controller configured to control On/Off functions of each of the FETs.

10. The backlight unit of claim 9, wherein:
the number of FETs is the same as the number of blocks, and the FET controller is configured to control On/Off functions of each of the blocks through On/Off control of each of the FETs.

11. The backlight unit of claim 9, wherein:
the FET controller is disposed in a drive IC, the drive IC comprising at least one of the FETs.

12. The backlight unit of claim 11, wherein:
the drive IC comprises all of the FETs.

13. The backlight unit of claim 11, wherein:
the drive controller is disposed in the drive IC.

14. The backlight unit of claim 1, further comprising:
a plurality of optical members, and each optical member covering each of the MJT LEDs,
wherein, assuming that major and minor axes of each of the MJT LEDs is a and b, respectively, light emitted through each of the optical members has a full width at half maximum greater than or equal to $0.6a$ and less than or equal to $\sqrt{a^2+b^2}$.

15. The backlight unit of claim 14, wherein:
light emitted through each of the optical members has a beam angle ($\theta$Lens), as represented by the Equation $$\theta_{Lens} > 2\tan^{-1}\left(\frac{FWHM_{LED}}{2OD}\right),$$

wherein FWHMLED is the full width at half maximum of light emitted from the MJT LED without the optical member and OD is a distance from a bottom surface of the MJT LED to a bottom surface of a diffusive plane.

16. The backlight unit of claim 1, wherein:
the upper electrode comprises a side surface having an inclination angle of 10 degrees to 45 degrees with respect to a surface of the first insulation layer.

17. The backlight unit of claim 1, wherein:
the upper electrode has a thickness within a range of 2000 Å to 10000 Å.

18. The backlight unit of claim 1, wherein:
the first insulation layer exposes a part of the reflective layer on the first light emitting cell, and the upper electrode is connected to the exposed part of the reflective layer.

19. The backlight unit of claim 1, wherein:
each of the light emitting cells exposes a part of the lower semiconductor layer through a via hole, and the upper electrode is connected to the lower semiconductor layer of a corresponding light emitting cell through the via hole.

20. The backlight unit of claim 1, wherein:
the upper electrode has a larger width than a width of a corresponding light emitting cell.

* * * * *